(12) United States Patent
Oshima et al.

(10) Patent No.: US 8,102,289 B2
(45) Date of Patent: Jan. 24, 2012

(54) ANALOG/DIGITAL CONVERTER AND SEMICONDUCTOR INTEGRATED CIRCUIT DEVICE

(75) Inventors: Takashi Oshima, Moriya (JP); Taizo Yamawaki, Tokyo (JP); Tomomi Takahashi, Musashino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/676,357

(22) PCT Filed: Feb. 19, 2009

(86) PCT No.: PCT/JP2009/052870
§ 371 (c)(1),
(2), (4) Date: Mar. 3, 2010

(87) PCT Pub. No.: WO2010/095232
PCT Pub. Date: Aug. 26, 2010

(65) Prior Publication Data
US 2011/0128171 A1 Jun. 2, 2011

(51) Int. Cl.
*H03M 1/10* (2006.01)
(52) U.S. Cl. ......... 341/120; 341/119; 341/155; 341/161
(58) Field of Classification Search .......... 341/117–120, 341/155, 161
See application file for complete search history.

(56) References Cited

U.S. PATENT DOCUMENTS

| | | | | |
|---|---|---|---|---|
| 4,763,105 | A * | 8/1988 | Jenq | 341/120 |
| 5,294,926 | A * | 3/1994 | Corcoran | 341/120 |
| 6,081,215 | A * | 6/2000 | Kost et al. | 341/120 |
| 7,394,415 | B2 * | 7/2008 | Fuse et al. | 341/120 |
| 2003/0080885 | A1 * | 5/2003 | Tamba | 341/120 |
| 2006/0250288 | A1 | 11/2006 | Fernandez et al. | |
| 2006/0267813 | A1 | 11/2006 | Asami | |
| 2006/0267814 | A1 | 11/2006 | Asami | |
| 2007/0120724 | A1 | 5/2007 | Hori et al. | |
| 2007/0171116 | A1 * | 7/2007 | Fuse et al. | 341/161 |

FOREIGN PATENT DOCUMENTS

EP 1401105 A1 * 3/2004

(Continued)

OTHER PUBLICATIONS

Hsu et al., "An 11b 800MS/s Time-Interleaved ADC with Digital Background Calibration", 2007 IEEE International Solid State Circuits Conference (ISSCC), Session 25.7, pp. 464-465 (2007).

(Continued)

*Primary Examiner* — Jean Jeanglaude
(74) *Attorney, Agent, or Firm* — Miles & Stockbridge P.C.

(57) ABSTRACT

In the digital calibration technique of the conventional time-interleaved analog/digital converter, it is impossible to perform highly-accurate calibration that supports a high-speed sampling rate of the next-generation application and achieves a high resolution. For its solution, a reference A/D conversion unit is connected in parallel to an input common to a time-interleaved A/D converter to be a calibration target, and the output of each unitary A/D conversion unit which makes up the time-interleaved A/D converter is calibrated in a digital region by using a low-speed high-resolution A/D conversion result output from the reference A/D conversion unit. Also, fCLK/N (fCLK represents an overall sampling rate of the time-interleaved A/D converter, and N is relatively prime to the number of unitary A/D conversion units connected in parallel M) is set as the operation clock frequency of the reference A/D conversion unit. In this configuration, samplings of all unitary A/D conversion units can be sequentially synchronized with the sampling of the reference A/D conversion unit, and the operation clock frequency of the reference A/D converter can be made N times slower than the overall sampling rate of the time-interleaved A/D converter.

18 Claims, 23 Drawing Sheets

FOREIGN PATENT DOCUMENTS

| | | |
|---|---|---|
| JP | 2006-313162 A | 11/2006 |
| JP | 2007-150640 A | 6/2007 |
| WO | WO 2006/126672 A1 | 11/2006 |

OTHER PUBLICATIONS

Liu et al., "A 600MS/s 30mW 0.13μm CMOS ADC Array Achieving Over 60dB SFDR with Adaptive Digital Equalization", 2009 IEEE International Solid State Circuits Conference (ISSCC), Session 4.5, pp. 82-83 (2009).

Liv, Wenbo, et al., "A 600MS/s 30mW 0.13um CMOS ADC Array Achieving Over 60db SFDR with Adaptive Digital Equalization", ISSCC 2009/Session 4/High-Speed Data Converters/4.5, 3 pages.

\* cited by examiner

CLOCK

SEMICONDUCTOR IC CHIP

SEMICONDUCTOR IC CHIP

ANALOG/DIGITAL CONVERTER AND SEMICONDUCTOR INTEGRATED CIRCUIT DEVICE

CROSS-REFERENCE TO RELATED APPLICATION

The present application is a 371 of International Application Number PCT/JP2009/52870 filed Feb. 19, 2009.

TECHNICAL FIELD

The present invention relates to an analog/digital (A/D) converter, and more particularly to a time-interleaved A/D converter that achieves a high sampling rate by concurrently operating a plurality of unitary A/D conversion units different in phase from each other, in particular, a time-interleaved A/D converter having a function of performing calibration for each unitary A/D conversion unit, and a semiconductor integrated circuit device having the A/D converter incorporated therein.

BACKGROUND ART

Conventionally, a time-interleaved A/D converter is made up of four unitary A/D conversion units, a maximum value of amplitude and a DC offset value of a conversion output of each unitary A/D conversion unit are calculated through a digital operation, and in order to make the resultant calculated values equal to the maximum amplitude value and the DC offset value of the output of a first unitary A/D conversion unit, conversion gains and DC offset values of the remaining three unitary A/D conversion units are corrected by using an LMS (Least Mean Square) algorithm (for example, refer to Non-Patent Document 1).

Also, conventionally, in a time-interleaved A/D converter which performs calibration by using a reference A/D converter, each unitary A/D conversion unit is synchronized with the reference A/D converter to obtain a reference signal for each sample (for example, refer to Patent Document 1).

Non-Patent Document 1: C Hsu (C. Hsu et al., "An 11b 800 MS/s time-interleaved ADC with digital background calibration", 2007 IEEE International Solid State Circuits Conference (ISSCC), Session 25.7, pp. 464-465 (2007))

Patent Document 1: Japanese Patent Application Laid-Open Publication No. 2007-150640

DISCLOSURE OF THE INVENTION

Problems to be Solved by the Invention

Any A/D converters prospectively applied in the future to 4G portable phones, WLAN of 802.11n onward, millimeter-wave radio, optical transceivers for 10 G bit/100 G bit Ethernet and others seem to require analog/digital conversion at a high sampling rate and with a high resolution, which are difficult to be achieved by any current single A/D converter, although specifications of the sampling rate and resolution vary. As an important technique for this, a time-interleaved A/D converter attracts attention in recent years. The time-interleaved A/D converter concurrently operates a plurality of (M) unitary A/D conversion units (M is assumed to be an integer equal to or larger than 2), thereby achieving, in principle, a high-speed (M-fold) sampling rate. In practice, however, it is known that an achievable effective resolution deteriorates when there is a mismatch in characteristics among the plurality of unitary A/D conversion units. Examples of the mismatch among the plurality of unitary A/D converters described above include a mismatch in conversion gain, a mismatch in DC offset voltage, a mismatch in sampling timing (that is, a skew among sampling CLKs of the respective unitary A/D conversion units), a mismatch in non-linearity, and a mismatch in frequency characteristics. Most of these pose problems more than those in the case of a single A/D converter. For example, since the DC offset voltage merely provides a DC offset to a conversion output in the case of a single A/D converter, the mismatch can be easily removed by a digital HPF or the like when a signal does not include a DC component. By contrast, since the A/D units sequentially operate while shifting time by 1/fCLK (here, fCLK represents an overall sampling rate of a time-interleaved A/D converter) in the case of a time-interleaved A/D converter, the mismatch in DC offset voltage among these units is added to a conversion output as a regular pattern. In a frequency domain, the pattern becomes a frequency tone of an integral multiple of the operation frequency of each unitary A/D conversion unit (that is, fCLK/M). Also, when a mismatch in conversion gain and a mismatch in sampling timing are present, each conversion output is subjected to amplitude modulation and phase modulation due to a time-interleave operation. For this reason, unwanted components spreading over a signal band centering on the frequency of an integral multiple of the operation frequency of the unitary A/D conversion unit described above are added to the conversion output. The separation of these unwanted components from a signal is not easy in general. Thus, a method of correcting the above-described mismatch through digital calibration has been suggested.

For example, FIG. 1 depicts a configuration of a calibration unit of a conventional time-interleaved A/D converter cited from Non-Patent Document 1. In Non-Patent Document 1, in the time-interleaved A/D converter made up of four unitary A/D conversion units, a maximum value of amplitude and a DC offset value of a conversion output of each unitary A/D conversion unit are calculated through a digital operation, and in order to make the resultant calculated values equal to the maximum amplitude value and the DC offset value of the output of a first unitary A/D conversion unit, conversion gains and DC offset values of the remaining three unitary A/D conversion units are corrected by using an LMS (Least Mean Square) algorithm. However, in this system, unlike Patent Document 1 described further below, no reference A/D converter which regularly notifies each unitary A/D conversion unit of a correct conversion result is provided, and instead, a first A/D conversion unit is used also as a reference A/D converter. However, under the operation principle of the time-interleaved system, the first unitary A/D conversion unit is different in sampling timing from second, third, and fourth unitary A/D conversion units. Therefore, the role as a reference A/D converter like in Patent Document 1 cannot be achieved in a true sense, and only "macro" information such as the maximum amplitude value and the DC offset can be notified. In other words, since each unitary A/D conversion unit cannot obtain a reference signal for each sample, fine correction cannot be made. More specifically, since the maximum amplitude values of the respective unitary A/D conversion units are not necessarily equal to each other in the first place depending on the signal, the correction for matching the maximum amplitude values of the output of all of the remaining A/D conversion units with the maximum amplitude value of the output of the first A/D conversion unit causes an error. Furthermore, since a response time for obtaining a maximum amplitude value is required, convergence time of the LMS algorithm may become long and a slew rate of the algorithm with respect to environmental variations may become slow. Also, since only macro reference information such as the maximum amplitude value and the DC offset can be obtained, items requiring finer reference information (for each sample) for correction such as a mismatch in sampling timing, a mismatch in non-linearity and a mismatch in frequency characteristics cannot be corrected.

On the other hand, Patent Document 1 discloses a method of performing calibration for a time-interleaved A/D converter by using a reference A/D converter (described as a teacher A/D converter in Specification). In this method, unlike Non-Patent Document 1 above, each unitary A/D conversion unit is synchronized with a reference A/D converter and can therefore obtain a reference signal for each sample. However, in the case of the configuration disclosed in Patent Document 1, the reference A/D converter operates at the overall sampling rate fCLK itself of the time-interleaved A/D converter, and therefore, a high-speed operation is demanded when the number of A/D conversion units operated concurrently M is increased. Even so, this is sufficiently useful in a conventional application in which the number of A/D conversion units operated concurrently M is small. However, particularly in the next-generation application as described at the beginning, since a high-speed time-interleaved A/D converter with a sampling rate of several hundreds of MS/s to several tens of GS/s is demanded, various restrictions are imposed when applying the technique of Patent Document 1, in which the reference A/D converter is required to operate at the same speed, to the next-generation application. Moreover, since the reference A/D converter is required to be operated at high speed, its resolution has to be decreased, and therefore, the reference signal supplied from the output thereof to each unitary A/D conversion unit includes large quantization noise. For this reason, in order to suppress such quantization noise, the band of a calibration algorithm is required to be decreased. However, since this is none other than weakening convergence of calibration, this poses problems of narrowing the degree of an allowable mismatch in calibration and delaying the response time of calibration, that is, the following capability to environmental variations. Furthermore, in practice, a reference A/D converter with a low-resolution involves not only large quantization noise but also large non-linearity, and the influence of the latter cannot be prevented by merely decreasing the band of the calibration algorithm, and as a result, this is thought to provide limitations to calibration accuracy.

As described above, in the digital calibration technique of the conventional time-interleaved A/D converter, it is difficult to perform highly-accurate calibration that supports a high-speed sampling rate of the next-generation application and achieves a high resolution.

Means for Solving the Problems

The typical ones of the inventions disclosed in the present application will be briefly described as follows. That is, an A/D converter according to the present invention is an A/D converter comprising M unitary A/D conversion units different in phase and equal in sampling rate (M is an integer equal to or larger than 2) connected in parallel to each other, the A/D converter having a sampling rate M times as high as that of the unitary A/D conversion unit, wherein a reference A/D conversion unit having a lower sampling rate and a higher resolution than the unitary A/D conversion unit is connected in parallel to the M unitary A/D conversion units, when the sampling rate of the A/D converter is N times as high as the sampling rate of the reference A/D conversion unit (N is an integer equal to or larger than 2), the M and the N are relatively prime to each other, and the A/D converter has a function of performing calibration for each of the M unitary A/D conversion units based on an output of the reference A/D conversion unit.

Also, a semiconductor integrated circuit device according to the present invention is a semiconductor integrated circuit device in which an A/D converter comprising M unitary A/D conversion units different in phase and equal in sampling rate (M is an integer equal to or larger than 2) connected in parallel to each other, the A/D converter having a sampling rate M times as high as that of the unitary A/D conversion unit, is formed on a single semiconductor substrate together with a clock source, wherein in the A/D converter, a reference A/D conversion unit having a lower sampling rate and a higher resolution than the unitary A/D conversion unit is connected in parallel to the M unitary A/D conversion units, when the sampling rate of the A/D converter is N times as high as the sampling rate of the reference A/D conversion unit (N is an integer equal to or larger than 2), the M and the N are relatively prime to each other, and the A/D converter has a function of performing calibration for each of the M unitary A/D conversion units based on an output of the reference A/D conversion unit.

Effects of the Invention

According to the present invention, in a time-interleaved A/D converter, it is possible to perform highly-accurate calibration that supports a high-speed sampling rate of the next-generation application and achieves a high resolution.

BRIEF DESCRIPTIONS OF THE DRAWINGS

BEST MODE FOR CARRYING OUT THE INVENTION

In each of the embodiments of the present invention, a reference A/D conversion unit is connected in parallel to an input common to a time-interleaved A/D converter to be a calibration target, and an output of each unitary A/D conversion unit which makes up the time-interleaved A/D converter is post-calibrated in a digital region by using a low-speed high-resolution A/D conversion result output from the reference A/D conversion unit. More specifically, calibration is performed at a latter stage (output side) of each unitary A/D conversion unit serving as a calibration target. By selecting fCLK/N (fCLK represents an overall sampling rate of the time-interleaved A/D converter, and N is relatively prime to the number of unitary A/D conversion units connected in parallel M) as the operation clock frequency of the reference A/D conversion unit, samplings of all unitary A/D conversion units can be sequentially synchronized with the sampling of the reference A/D conversion unit, and the operation clock frequency of the reference A/D converter can be made N times slower than the overall sampling rate of the time-interleaved A/D converter. With using a conversion output supplied from the reference A/D converter as a reference signal that regularly tells a correct A/D conversion result of each unitary A/D conversion unit, a digital calibration unit can correct various mismatches among the respective unitary A/D conversion units in a background during a normal operation of the A/D converter. More specifically, the present invention is characterized by focusing on the point that, by appropriately selecting the operation clock frequency of the reference A/D converter, it can be sequentially synchronized with the operation clock edge of each unitary A/D conversion unit even in a sufficiently slower operation than the overall sampling rate of the time-interleaved A/D converter. Furthermore, a timing of sampling of the unitary A/D conversion unit is generated from an operation clock input to each of M unitary A/D conversion units. In this case, the sampling rate corresponds to an operation clock frequency representing the frequency of the operation clock.

Each of the embodiments of the present invention will be described in detail below with reference to the drawings.

First Embodiment

Figure 1:
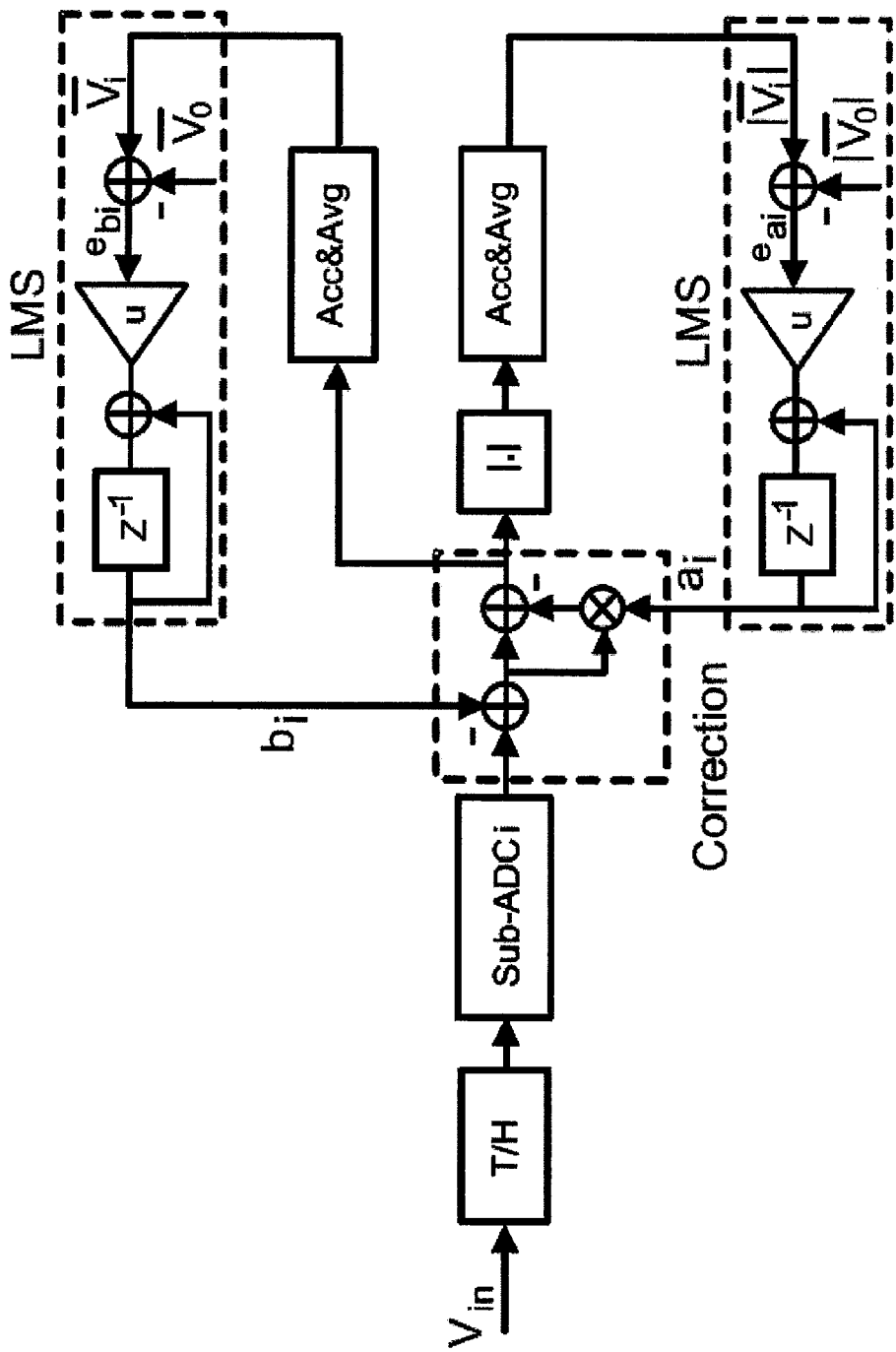
FIG. 1 is a block configuration diagram depicting a digital-calibration system in a conventional time-interleaved A/D converter.
Figure 2:
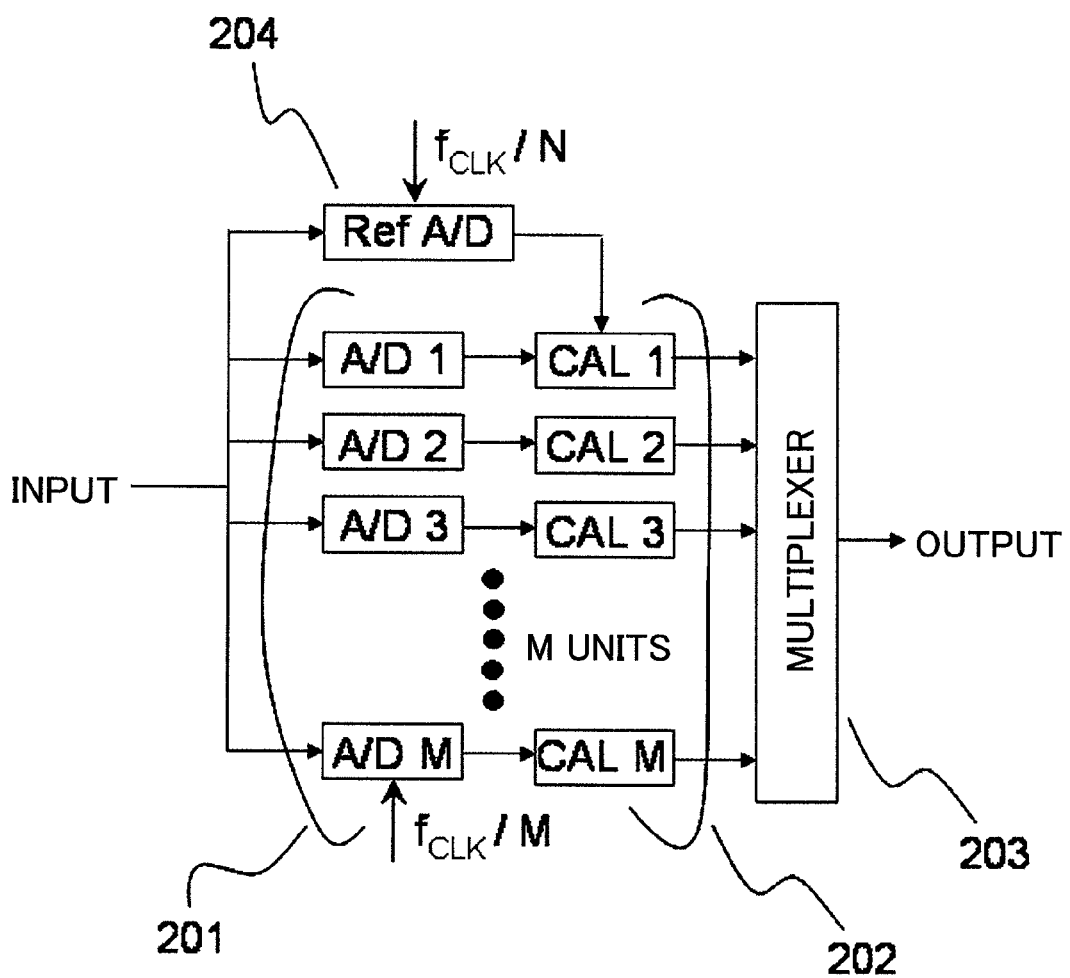
FIG. 2 is a diagram depicting the entire configuration of a first embodiment of the present invention.
Figure 3:
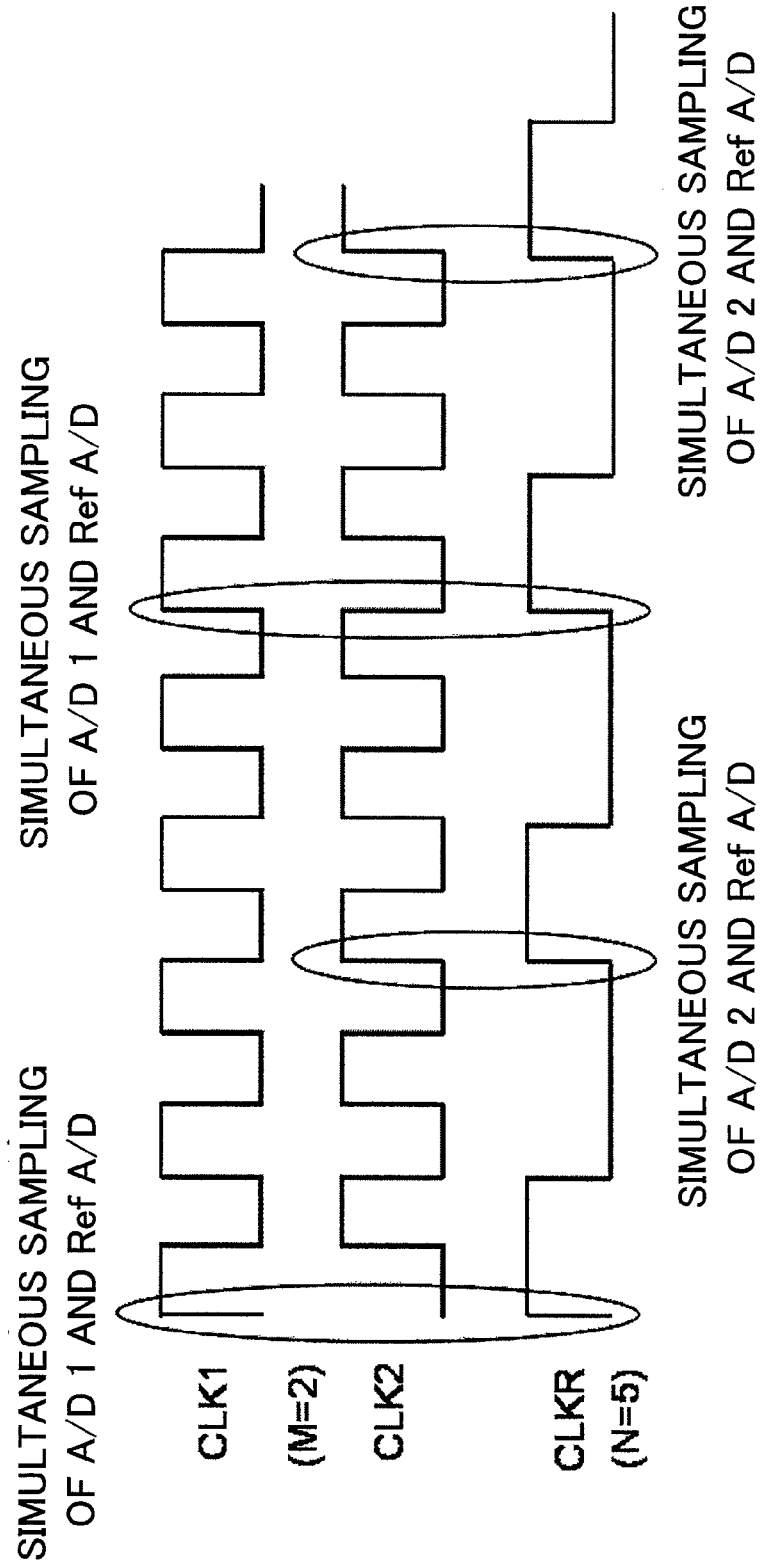
FIG. 3 is a diagram depicting a time chart of the first embodiment of the present invention.

FIG. 2 depicts a first embodiment of the present invention. In the present embodiment, the most basic idea of the present invention is disclosed. The embodiment includes a plurality of (M) (M is assumed to be an integer equal to or larger than 2) unitary A/D conversion units 201 (A/D 1 to A/D M), digital calibration units 202 (CAL 1 to CAL M) subsequent thereto, respectively, a multiplexer 203 taking an output of each digital calibration unit in sequence, and a reference A/D conversion unit 204 connected to an input in parallel to each of the unitary A/D conversion units 201. Each unitary A/D conversion unit 201 operates in a similar manner to that of a normal time-interleaved A/D converter. More specifically, it operates at an operation CLK of the sampling CLK frequency fCLK/M, and each sampling timing is sequentially shifted in time by 1/fCLK. On the other hand, the reference A/D conversion unit 204 operates at an operation CLK of fCLK/N. Here, N is selected so that sampling of each unitary A/D conversion unit 201 is regularly synchronized with sampling of the reference A/D conversion unit 204. For example, a value can be selected as N so as to be relatively prime to the number of unitary A/D conversion units 201 connected in parallel M. FIG. 3 depicts a timing diagram when M=2 and N=5. In this case, a first A/D conversion unit and a second A/D conversion unit can both be synchronized with sampling of the reference A/D conversion unit 204 once every five samples. By this means, calibration using a conversion output of the reference A/D conversion unit 204 as a reference signal can be performed in each digital calibration unit 202. As a result, since the DC offset voltage, conversion gain, and sampling timing of each unitary A/D conversion unit are corrected so as to be equal to the DC offset voltage, conversion gain, and sampling timing of the reference A/D conversion unit 204, mismatches among the unitary A/D conversion units can be eliminated.

Figure 4:
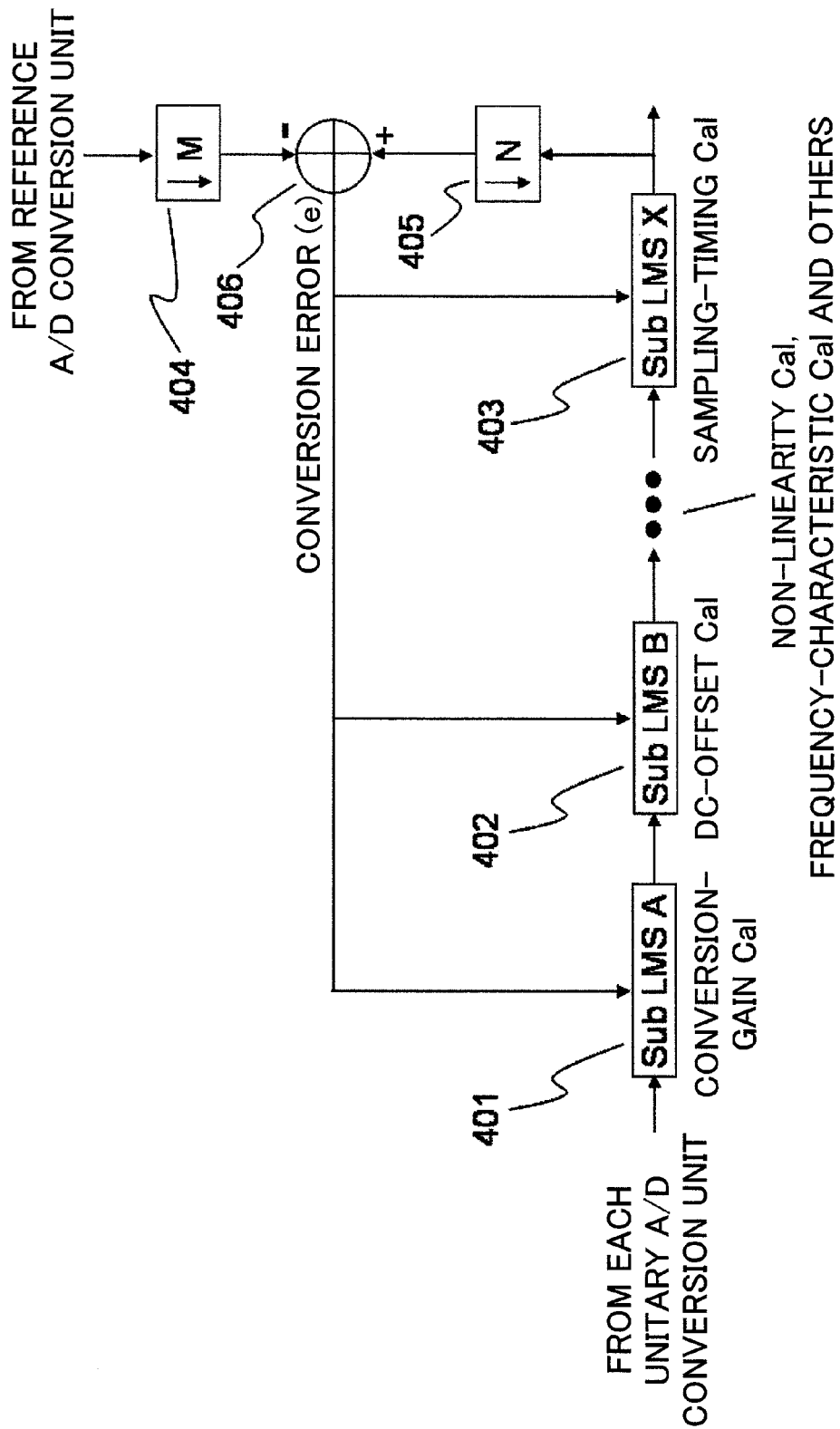
FIG. 4 is a diagram depicting details of the configuration of the first embodiment of the present invention.

FIG. 4 depicts a configuration example of each digital calibration unit 202. As for an output from each unitary A/D conversion unit 201, its conversion gain, DC offset, and sampling timing are corrected in a conversion-gain calibration unit 401 (Sub LMS A), a DC-offset calibration unit 402 (Sub LMS B), and a sampling-timing calibration unit 403 (Sub LMS X) with, for example, an LMS algorithm so as to be equal to the conversion gain, DC offset, and sampling timing of the reference A/D conversion unit 204, respectively. Note that, other than these, for example, a non-linearity calibration unit and a frequency-characteristic calibration unit may be provided. For performing the above-described correction, it is necessary to obtain a difference in output between the digital calibration units, that is, a conversion error (e) with using the conversion output of the reference A/D conversion unit 204 as a reference signal and supply it to each of the calibration units 401, 402, 403 and others. For synchronizing the output of the reference A/D conversion unit 204 and the output of each digital calibration unit with each other, the former is down-sampled by a down-sampler 404 once every M times and the latter is down-sampled by a down-sampler 405 once every N times, and thereafter, a difference therebetween is calculated by a subtracting unit 406 as the conversion error.

Figure 5:
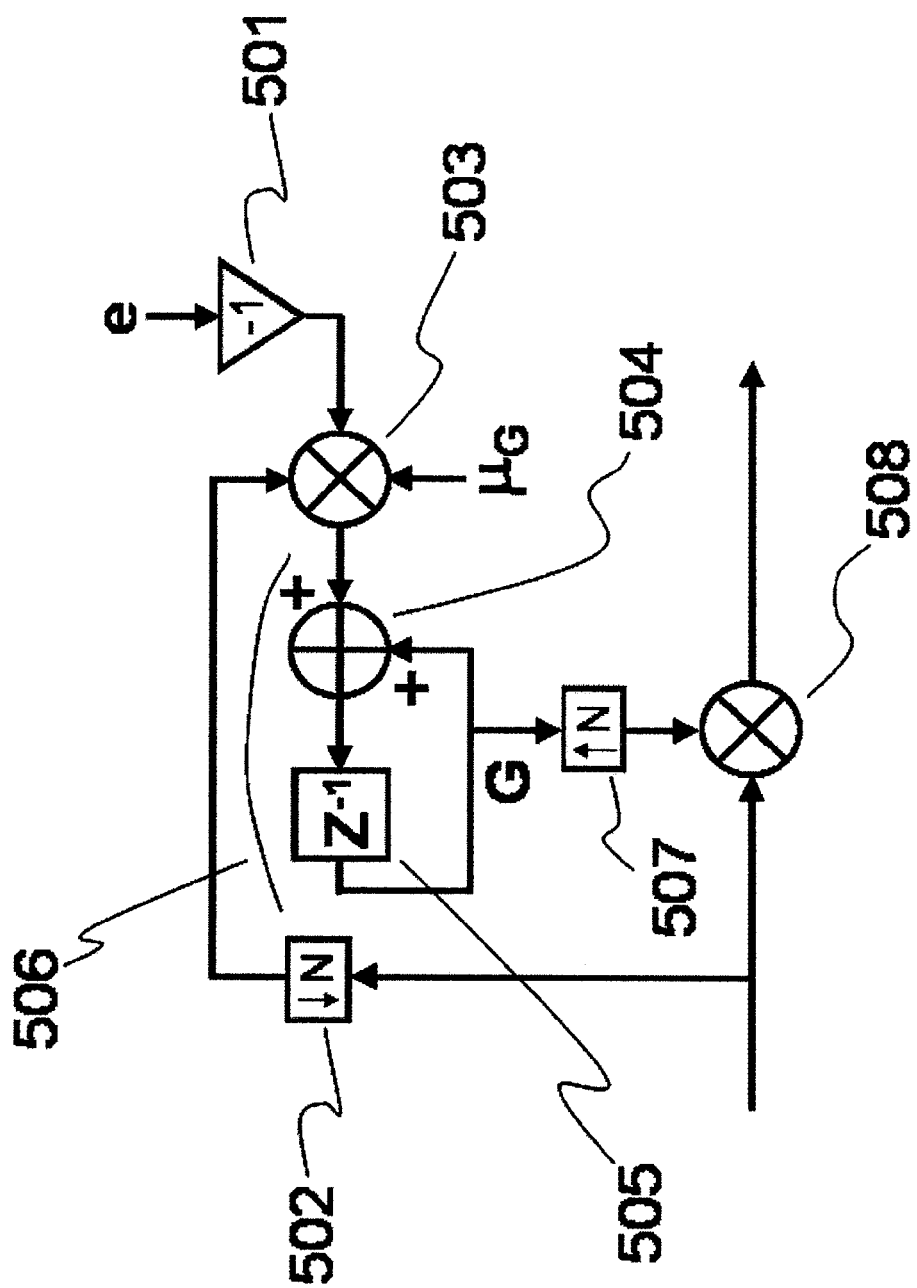
FIG. 5 is a diagram depicting details of the configuration of the first embodiment of the present invention.
Figure 6:
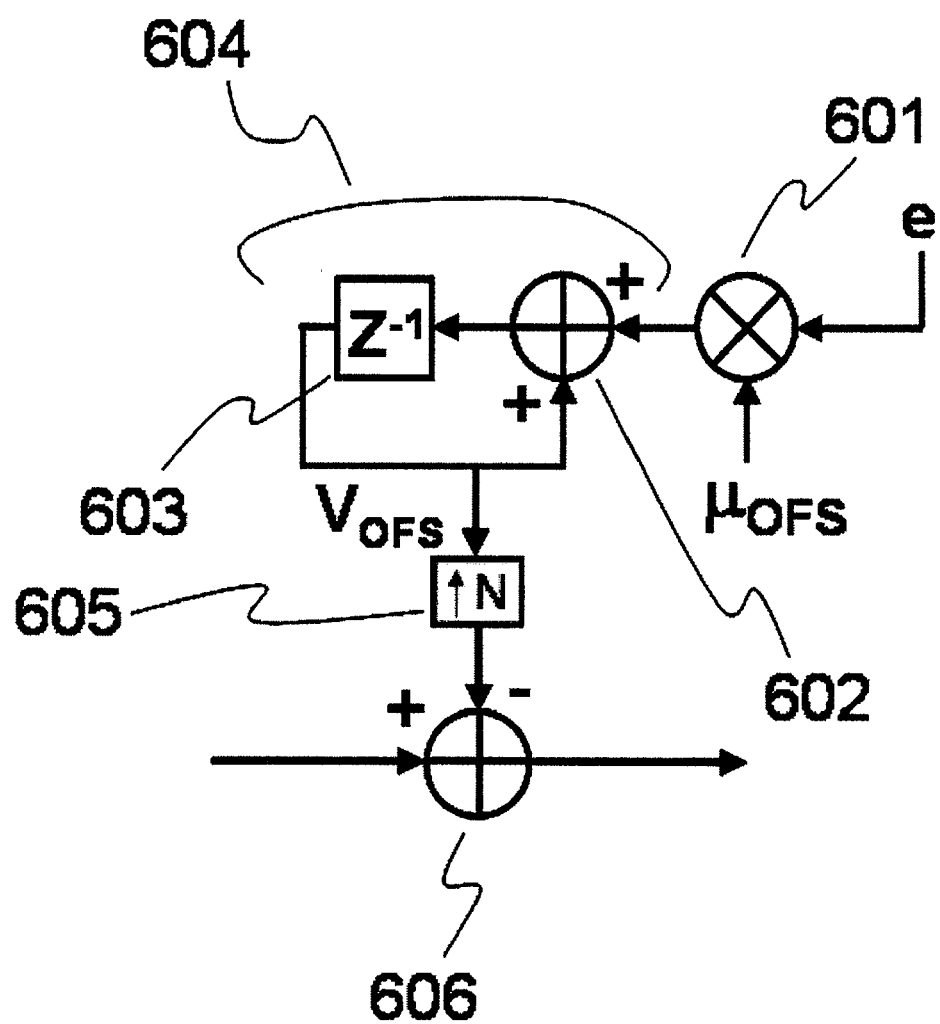
FIG. 6 is a diagram depicting details of the configuration of the first embodiment of the present invention.
Figure 7:
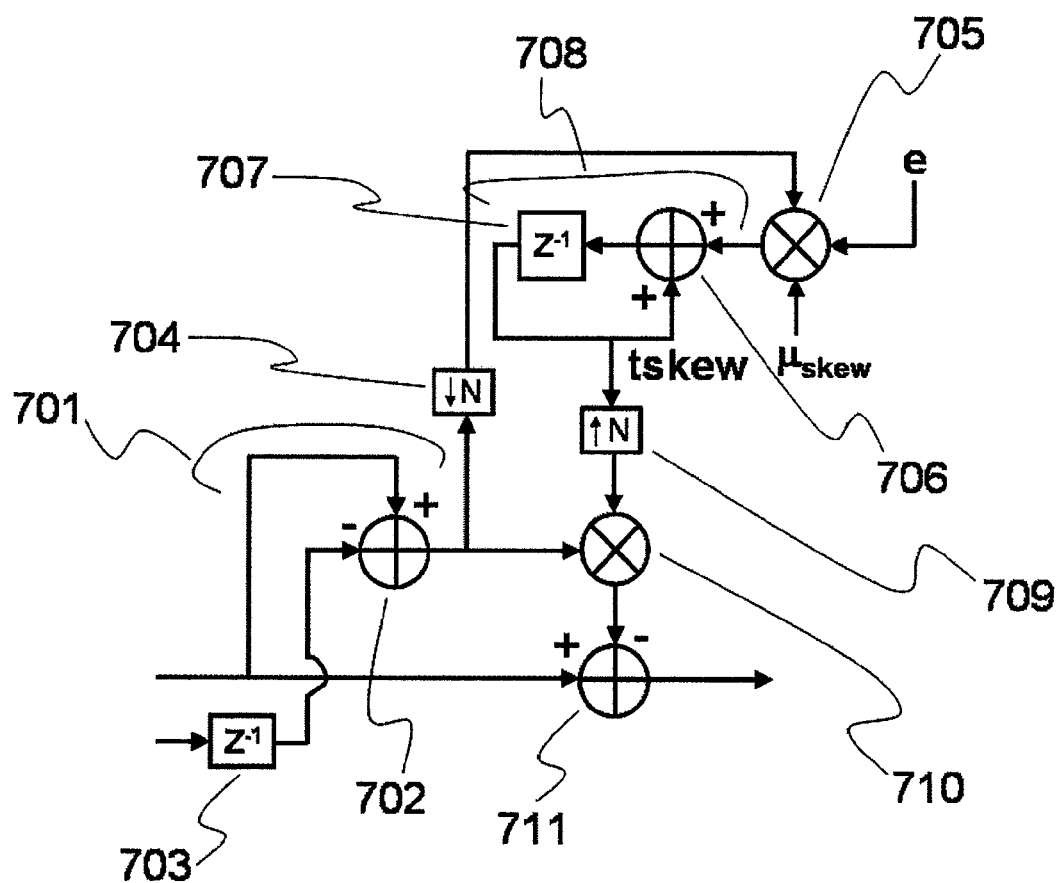
FIG. 7 is a diagram depicting details of the configuration of the first embodiment of the present invention.

FIG. 5 to FIG. 7 depict configuration examples of the conversion-gain calibration unit 401, the DC-offset calibration unit 402, and the sampling-timing calibration unit 403, respectively. The conversion-gain calibration unit depicted in FIG. 5 operates as follows. First, the conversion error (e) supplied in the above-described manner has its sign reversed by a reversing unit 501. Also, an input signal to the conversion-gain calibration unit is down-sampled in a down-sampler 502 once every N times for synchronization. These two signals and a parameter μG determining a transfer function of a loop are multiplied together at a multiplier 503, and then are integrated in an accumulator 506 made up of an adder 504 and a delayer 505. This integral output is rate-converted N fold in an up-sampler 507 so as to be multiplied at a matched rate with an input signal to the conversion-gain calibration unit, and is multiplied by the input signal in a multiplier 508 and then output therefrom. Assuming that the conversion gain of a certain unitary A/D conversion unit is varied or fluctuated k times as much as the conversion gain of the reference A/D conversion unit 204, an output G of the accumulator 506 converges to 1/k, thereby absorbing a mismatch in conversion gain.

In the DC-offset calibration unit depicted in FIG. 6, the conversion error (e) supplied in the above-described manner and a parameter μOFS determining a transfer function of a loop are multiplied together in a multiplier 601, and are then integrated in an accumulator 604 made up of an adder 602 and a delayer 603. This integral output VOFS is rate-converted N fold in an up-sampler 605 so as to be subtracted at a matched rate with an input signal to the DC-offset calibration unit, and is subtracted from the input signal in a subtractor 606 and then output therefrom. Assuming that the DC offset voltage of a certain unitary A/D conversion unit is higher than the DC offset voltage of the reference A/D conversion unit 204 by ΔV, the output VOFS of the accumulator 604 converges to ΔV, thereby absorbing a mismatch in DC offset voltage.

The sampling-timing calibration unit depicted in FIG. 7 operates as follows. For correcting the sampling timing, a skew Δt between the sampling clock of the reference A/D conversion unit 204 and the sampling clock of each unitary A/D conversion unit has to be obtained. A block that is the most important for this is a block that derives a time differentiation of an input signal to the sampling-timing calibration unit. The present embodiment shows an example of performing it in the simplest way by using a difference. A difference unit 701 is made up of a subtractor 702 and a one-sample delayer 703. An input signal to the sampling-timing calibration unit in the digital calibration unit subsequent to a unitary A/D conversion unit operating prior to the relevant unitary A/D conversion unit by one sample is delayed by one sample in the above-mentioned one-sample delayer 703, and is subtracted from an input signal to the relevant sampling-timing calibration unit in the above-mentioned subtractor 702, thereby deriving a difference of the input signal to the relevant sampling-timing calibration unit. This difference signal is down-sampled once every N times in a down-sampler 704 so as to be synchronized with a conversion error signal (e) supplied to the sampling-timing calibration unit. Then, after the conversion error, the difference signal and a parameter μskew determining a transfer function of a loop are multiplied together in a multiplier 705, they are integrated in an accumulator 708 made up of an adder 706 and a delayer 707. This integral output tskew is rate-converted N fold in an up-sampler 709 so as to match its rate with that of an input signal to the sampling-timing calibration unit and is multiplied by the above-mentioned difference signal in a multiplier 710, and is then subtracted from the input signal in a subtractor 711 and output therefrom. Assuming that the sampling clock of a certain unitary A/D conversion unit has a skew of Δt with respect to the sampling clock of the reference A/D conversion unit 204, the output tskew of the accumulator 708 converges to ΔV, thereby absorbing a mismatch in sampling timing according to the next [Equation 1].

$$V(t) \approx V(t+\Delta t) - \Delta t \cdot \frac{dV}{dt} \qquad \text{Equation 1}$$

Figure 8:
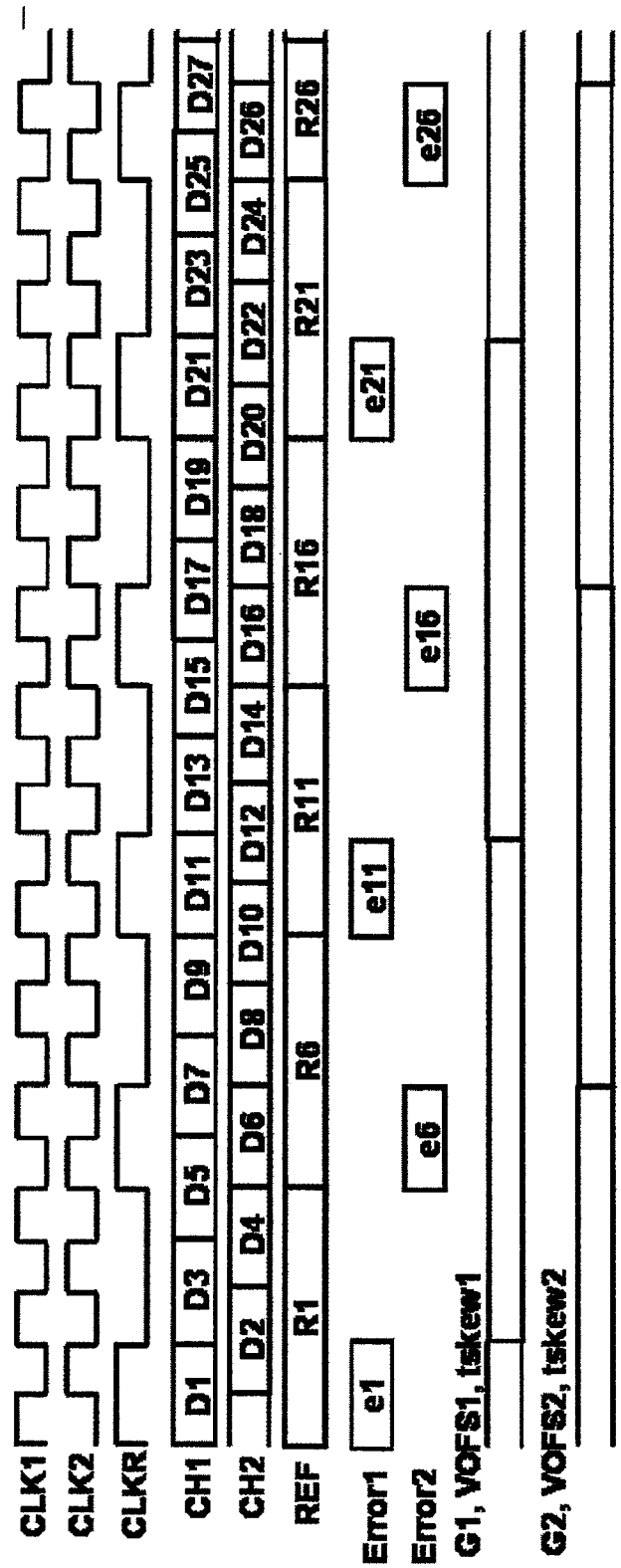
FIG. 8 is a diagram depicting details of the time chart of the first embodiment of the present invention.

FIG. 8 depicts a timing diagram of the present embodiment. Here, by way of example, the number of unitary A/D conversion units 201 connected in parallel is set as M=2, and the operation clock frequency of the reference A/D conversion unit 204 is set as N=5. At this time, the operation clocks CLK1 and CLK2 of the first and second unitary A/D conversion units have a frequency of fCLK/2, and the operation clock CLKR of the reference A/D conversion unit 204 has a frequency of fCLK/5. Note that fCLK is an overall sampling rate of the time-interleaved A/D converter. By this means, the first unitary A/D conversion unit and the second unitary A/D conversion unit alternately perform sampling for analog/digital conversion, and then output D1, D2, D3, D4, . . . in sequence. Also, the reference A/D conversion unit 204 performs sampling and analog/digital conversion at a speed ⅖ times slower than that of each unitary A/D conversion unit, and then outputs. R1, R6, R11, R16, . . . in sequence. Note that, for ease of understanding, each suffix attached to R is matched with a sampling number of the unitary A/D conversion unit synchronized in sampling timing. In the example of this drawing, the first unitary A/D conversion unit has its outputs D1, D11, D21, . . . synchronized with the outputs R1, R11, R21, . . . of the reference A/D conversion unit 204, and therefore, their conversion errors e1, e11, e21, . . . are calculated as described above, and based on the results, outputs of G1, VOFS1, and tskew1 of the accumulators included in the conversion-gain calibration unit, the DC-offset calibration unit, and the sampling-timing calibration unit in the first digital calibration unit are updated in the above-described manner. Similarly, the second unitary A/D conversion unit has its outputs D6, D16, D26, . . . synchronized with the outputs R6, R16, R26, . . . of the reference A/D conversion unit 204, and therefore, their conversion errors e6, e16, e26, . . . are calculated as described above, and based on the results, outputs of G2, VOFS2, and tskew2 of the accumulators included in the conversion-gain calibration unit, the DC-offset calibration unit, and the sampling-timing calibration unit in the second digital calibration unit are updated in the above-described manner. As described above, each of G1, G2, VOFS1, VOFS2, tskew1, and tskew2 are automatically corrected with the LMS algorithm so as to eliminate mismatches with the reference A/D conversion unit 204. As a result, each mismatch between the first unitary A/D conversion unit and the second unitary A/D conversion unit is also eliminated.

Therefore, according to the present embodiment, it is possible to perform highly-accurate calibration that supports a high-speed sampling rate of the next-generation application and achieves a high resolution in a time-interleaved A/D converter.

Second Embodiment

Figure 9:
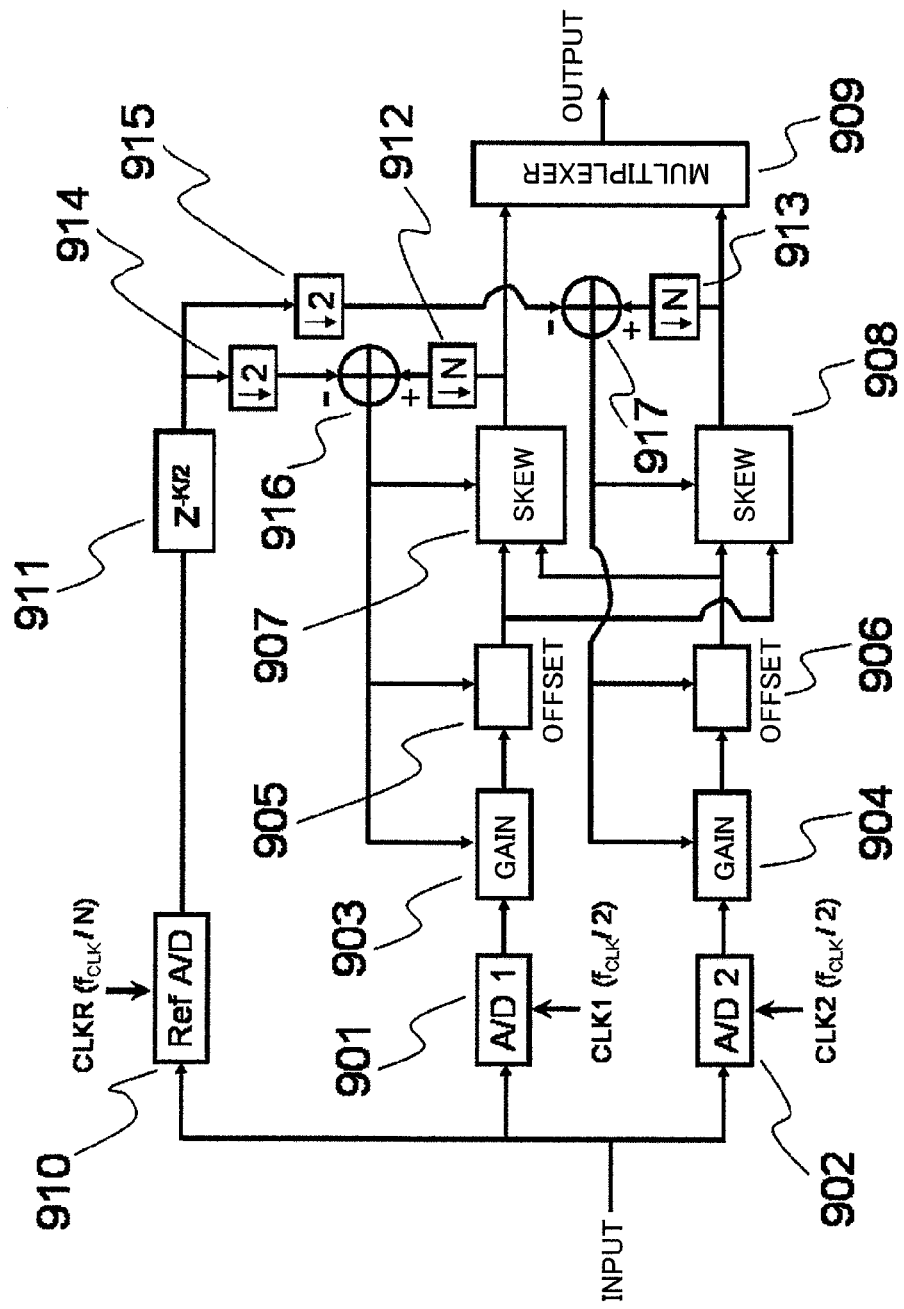
FIG. 9 is a diagram depicting the entire configuration of a second embodiment of the present invention.
Figure 13:
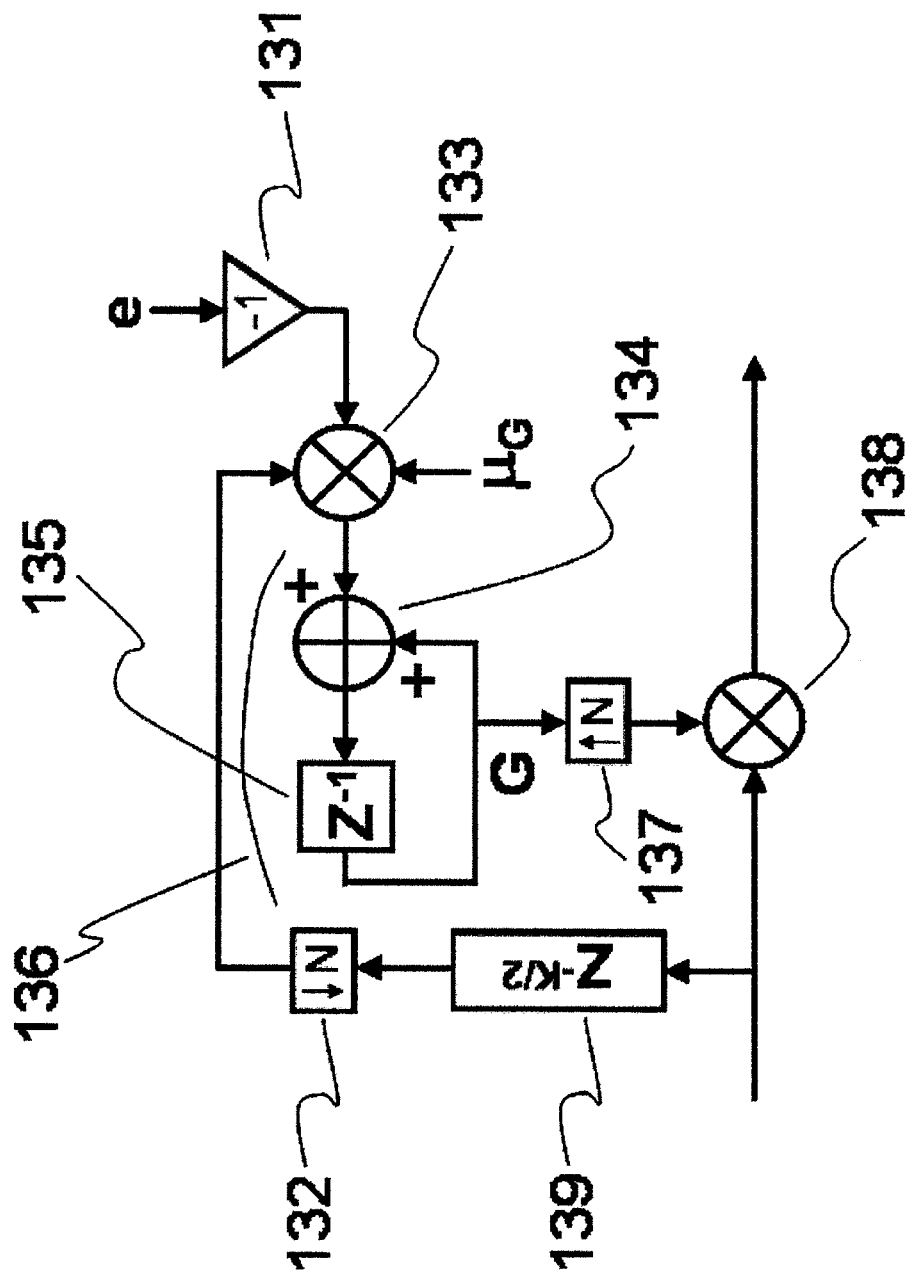
FIG. 13 is a diagram depicting details of the configuration of the second embodiment of the present invention.

FIG. 9 depicts a second embodiment of the present invention. In the present embodiment, the number of unitary A/D conversion units connected in parallel M is set to 2 and N=5 is selected as the operation clock frequency of the reference A/D conversion unit like in the first embodiment, and a time differentiator used for a sampling-timing calibration unit is replaced by a time differentiator with a higher accuracy from a simple difference unit as in the first embodiment. To compensate for a delay time of K/2 sample occurring in the time differentiator described below (one sampling time is defined as 1/fCLK), a delayer 911 for K/2 sample is required, but no other major changes are made in FIG. 9. Also, the conversion-gain calibration units 903 and 904 have a configuration depicted in FIG. 13. In FIG. 13, again, to compensate for a delay time of K/2 sample occurring in the time differentiator, a delayer 139 for K/2 sample is required, but its operation is similar to that described in the first embodiment. In the present embodiment, the sampling-timing calibration units 907 and 908 of FIG. 9 have the configuration of FIG. 10. In this configuration, the difference from the sampling-timing calibration unit (FIG. 7) in the first embodiment is that a highly-accurate time differentiator 101 and a time second-order differentiator 102 are introduced and a skew Δt in sampling timing between the reference A/D conversion unit and the unitary A/D conversion unit is corrected with higher accuracy than that of the first embodiment.

$$V(t) = V(t + \Delta t) - \Delta t \cdot \frac{dV}{dt} - \frac{1}{2} \cdot \Delta t^2 \cdot \frac{d^2 V}{dt^2} \qquad \text{Equation 2}$$

Figure 11:
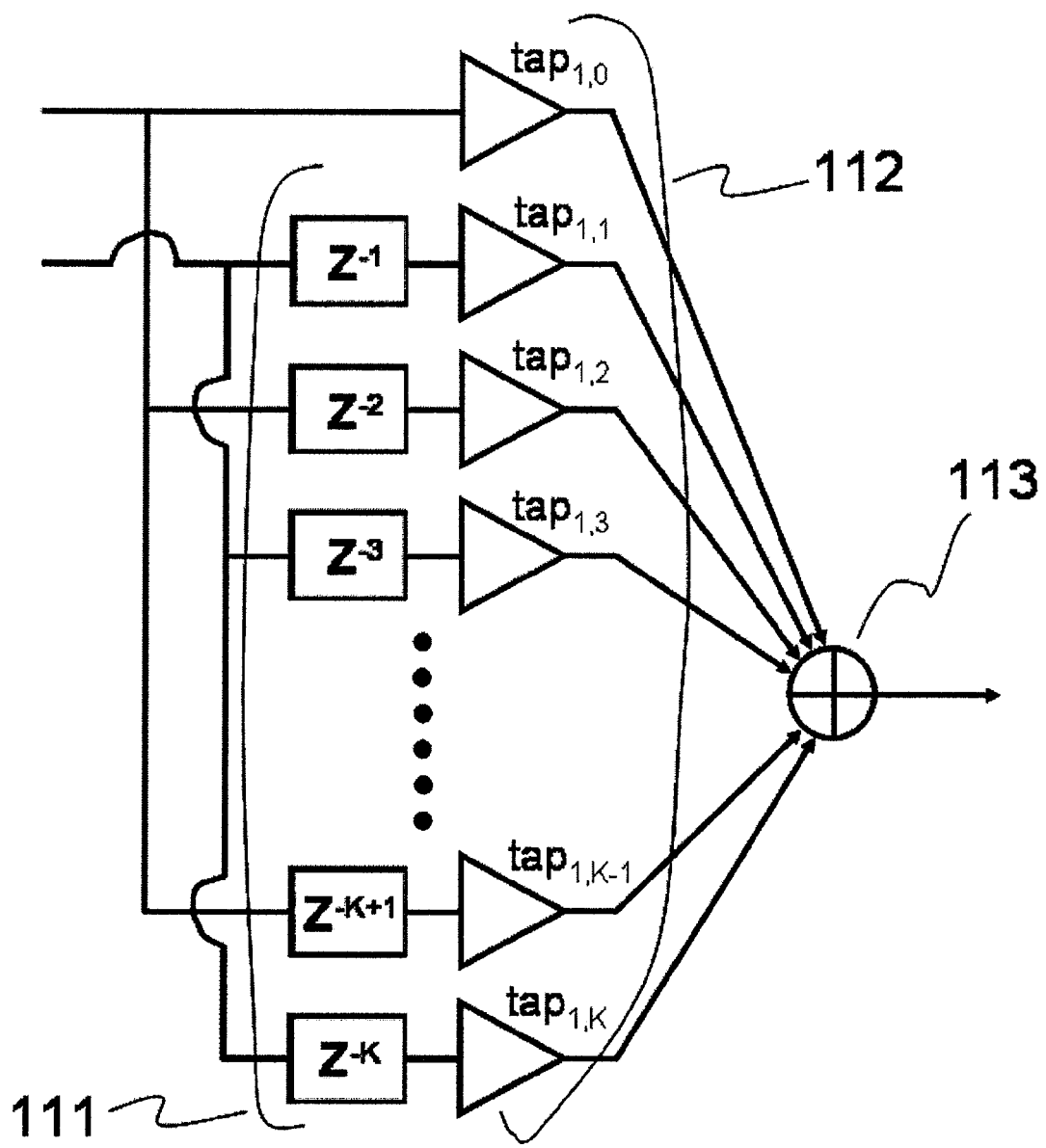
FIG. 11 is a diagram depicting details of the configuration of the second embodiment of the present invention.
Figure 12:
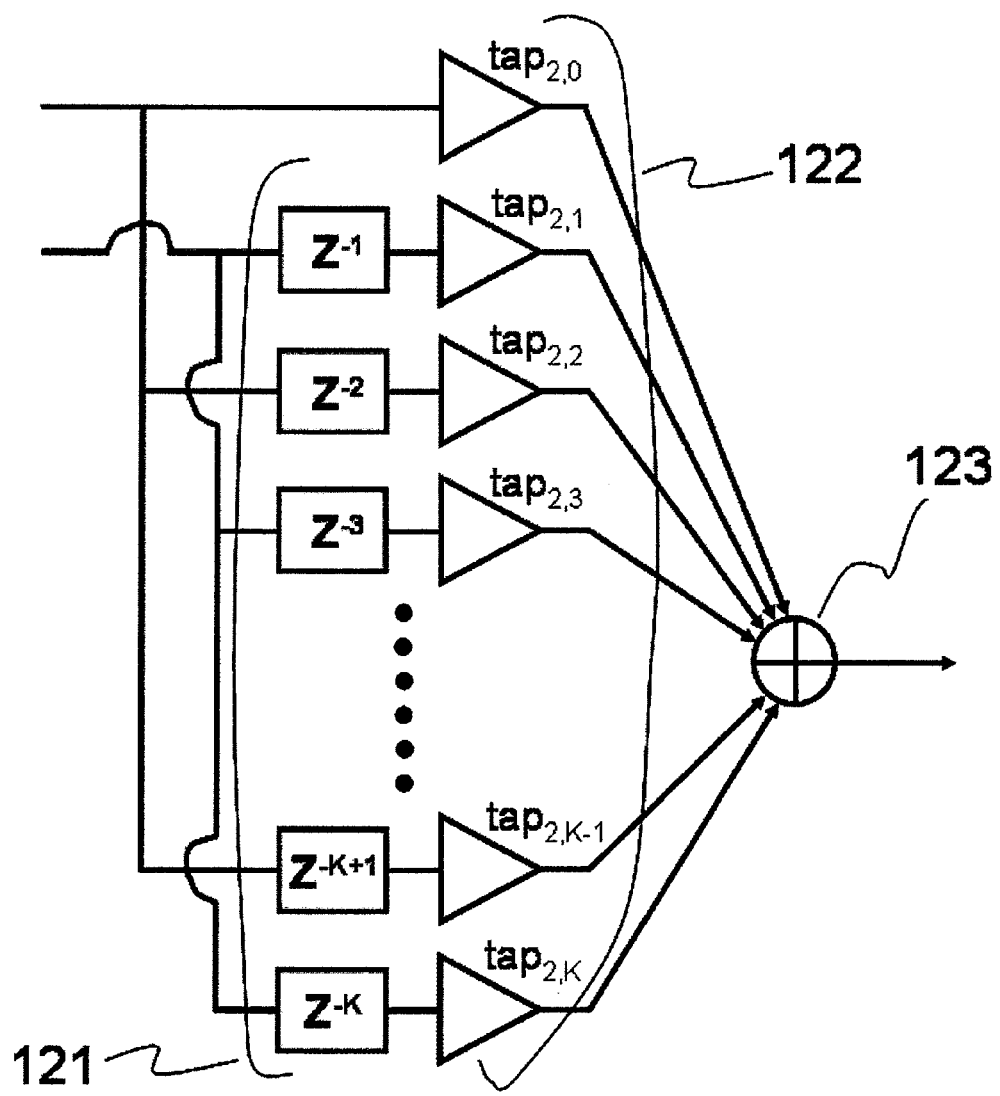
FIG. 12 is a diagram depicting details of the configuration of the second embodiment of the present invention.

For this purpose, the third item in the Equation 2 depicted above is corrected by a multiplier 1010 and a subtractor 1013. The configurations of the time differentiator 101 and the time second-order differentiator 102 are depicted in FIG. 11 and FIG. 12, respectively. Both can be achieved as an FIR filter made up of a finite number of taps, and include the delayers 111 and 121, the multipliers 112 and 122 with respective tap coefficients, and adders 113 and 123 which add the multiplication results. In both of FIG. 11 and FIG. 12, an input on an upper side is from the relevant unitary A/D conversion unit, and an input on a lower side is from the remaining one unitary A/D conversion unit. Also, each input is connected to each tap for every two taps. Note that, although the number of unitary A/D conversion units M is 2 in the present embodiment, for example, in the case of M=3, the number of inputs is three, and the top input is from the relevant unitary A/D conversion unit, the second input is from a unitary A/D conversion unit that performs sampling one unit before the relevant unitary A/D conversion unit, and the third input is from a unitary A/D conversion unit that performs sampling two units before the relevant unitary A/D conversion unit, and each input is connected to each tap for every three taps. Similarly, this can be extended when the number of unitary A/D conversion units is general (M).

A tap coefficient tap1,i of the time differentiator (FIG. 11) and a tap coefficient tap2,i of the time second-order differentiator (FIG. 12) can be derived as equations depicted in [Equation 4] to [Equation 7] below by performing first-order differentiation and second-order differentiation with time on the equation of sampling theorem depicted in [Equation 3] below.

$$\pi(t) = \sum_{n=-\infty}^{\infty} \pi_n \cdot \frac{sir\{\pi \cdot (f_{CLK} \cdot t - n)\}}{\pi(f_{CLK} \cdot t - n)} \qquad \text{Equation 3}$$

$$tap_{1,K/2} = 0 \qquad \text{Equation 4}$$

$$tap_{1,K/2-n} = (-1)^{n+1} \cdot \frac{1}{n} \cdot f_{CLK} \qquad \text{Equation 5}$$

$$tap_{2,K/2} = -\frac{\pi^2}{3} \cdot f_{CLK}^2 \qquad \text{Equation 6}$$

$$tap_{2,K/2-n} = 2(-1)^{n+1} \cdot \frac{1}{n^2} \cdot f_{CLK}^2 \qquad \text{Equation 7}$$

$$W_{K/2-n} = 0.54 - 0.46 \cdot \cos\left(\frac{2\pi\left(\frac{K}{2} - n\right)}{K}\right) \qquad \text{Equation 8}$$

Note that the number of taps of the FIR filter is set to K+1. Also, K is assumed to be selected as a multiple of 4. Also, when the number of taps is decreased so as to reduce the implementation size and consumed current, each tap coefficient in [Equation 4] to [Equation 7] is multiplied by, for example, a window function in [Equation 8], and the result is taken as a tap coefficient to be eventually adopted. In this manner, an influence of truncation error due to a finite number of taps can be avoided.

Figure 10:
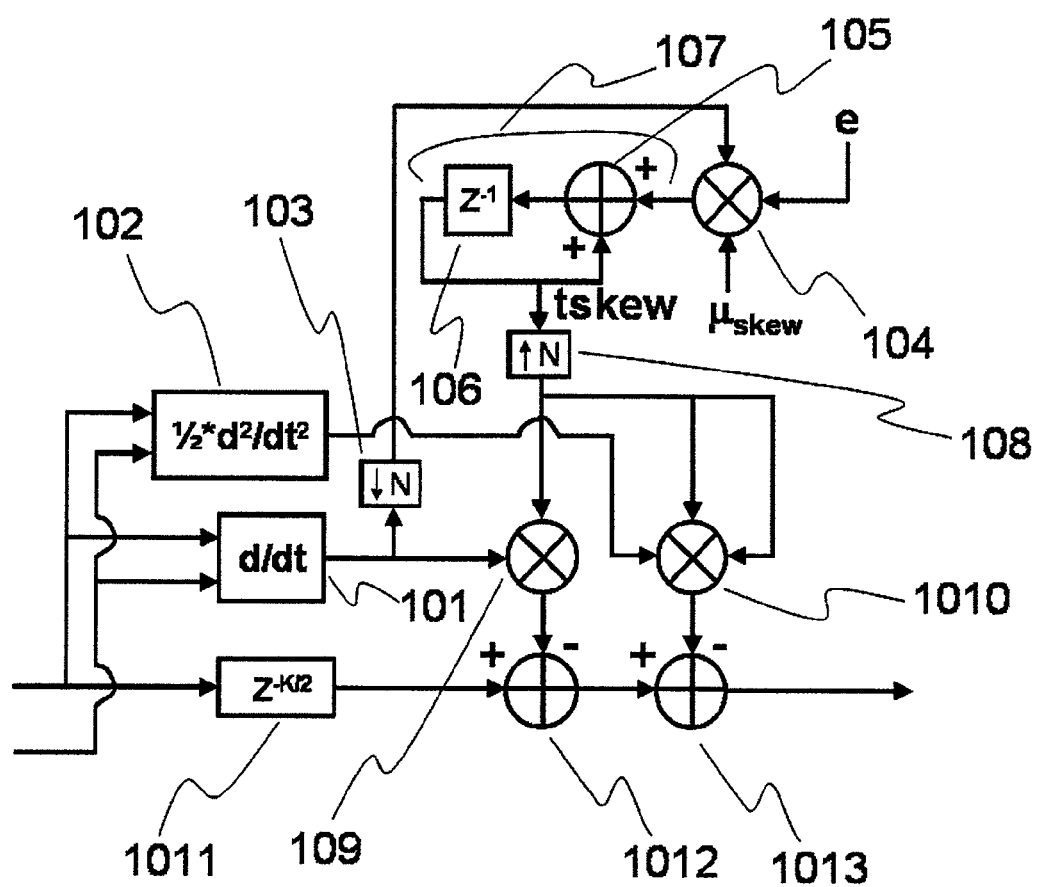
FIG. 10 is a diagram depicting details of the configuration of the second embodiment of the present invention.
Figure 14:
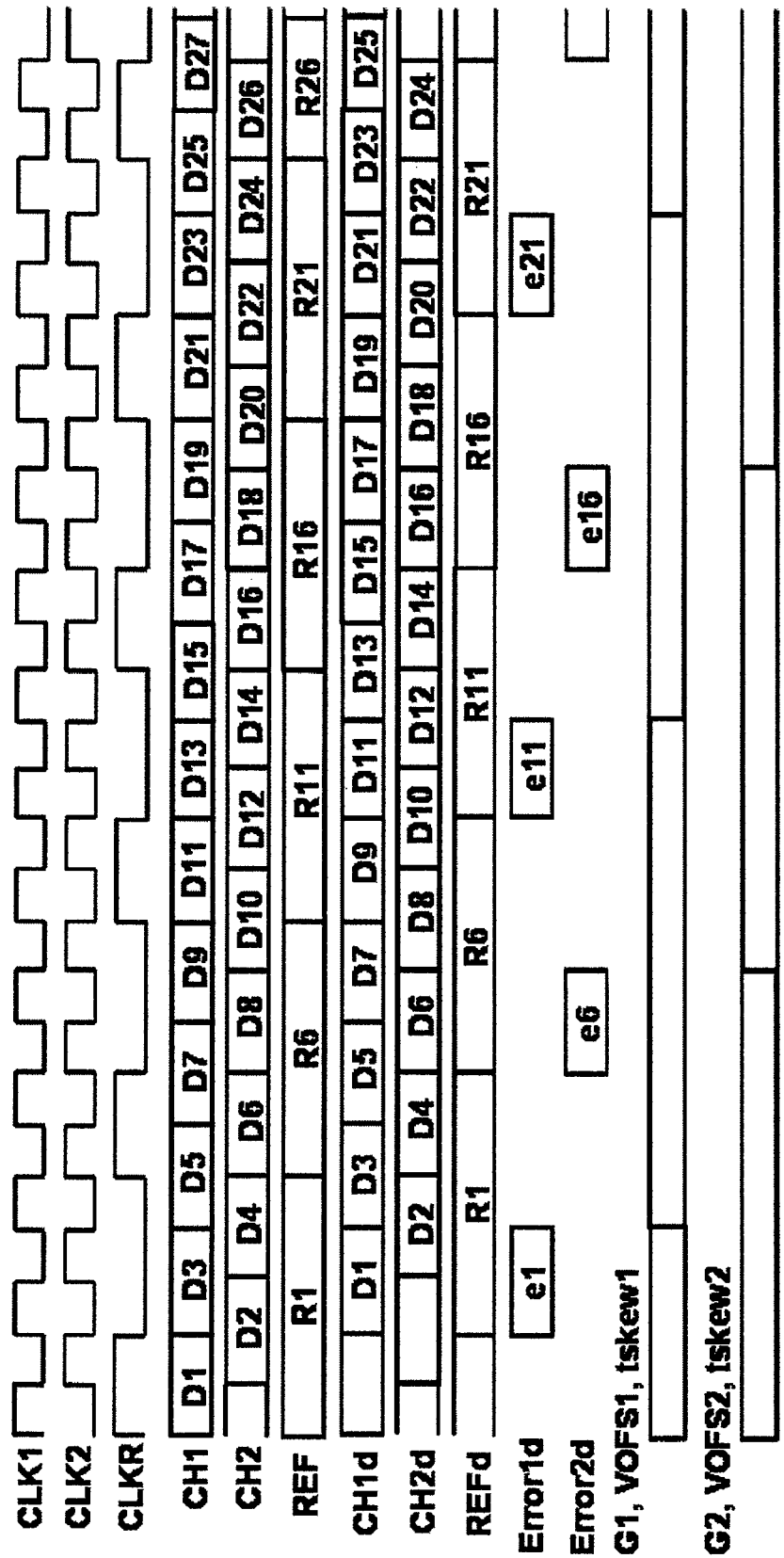
FIG. 14 is a diagram depicting details of a time chart of the second embodiment of the present invention.

In the time differentiator and time second-order differentiator described above, a delay time for a K/2 sample (one sampling time is defined as 1/fCLK) occurs, and therefore, the input signal is delayed and compensated by a K/2-sample delayer 1011 in FIG. 10. Note that FIG. 14 depicts an operation timing diagram of the present embodiment.

Therefore, according to the present embodiment, it is possible to perform highly-accurate calibration that supports a high-speed sampling rate of the next-generation application and achieves a high resolution in a time-interleaved A/D converter.

Third Embodiment

Figure 15:
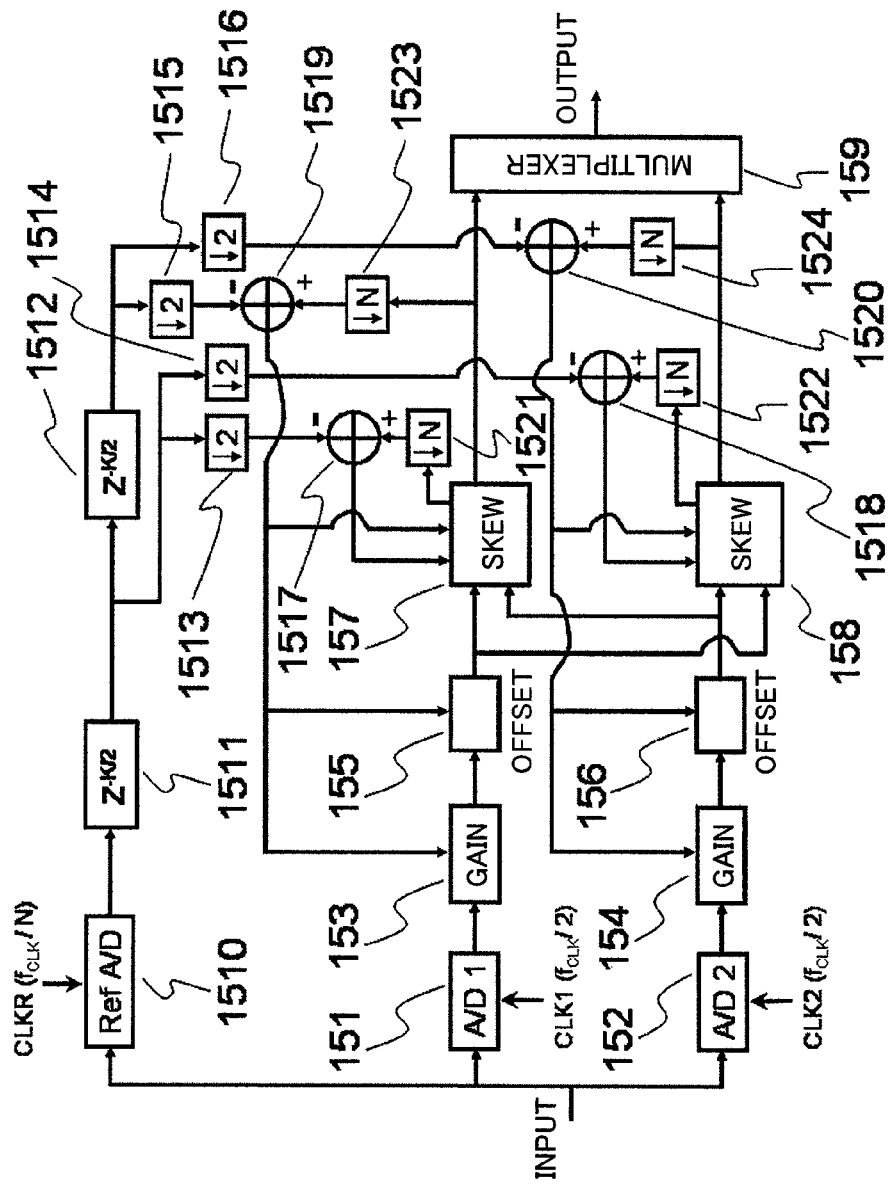
FIG. 15 is a diagram depicting the entire configuration of a third embodiment of the present invention.
Figure 16:
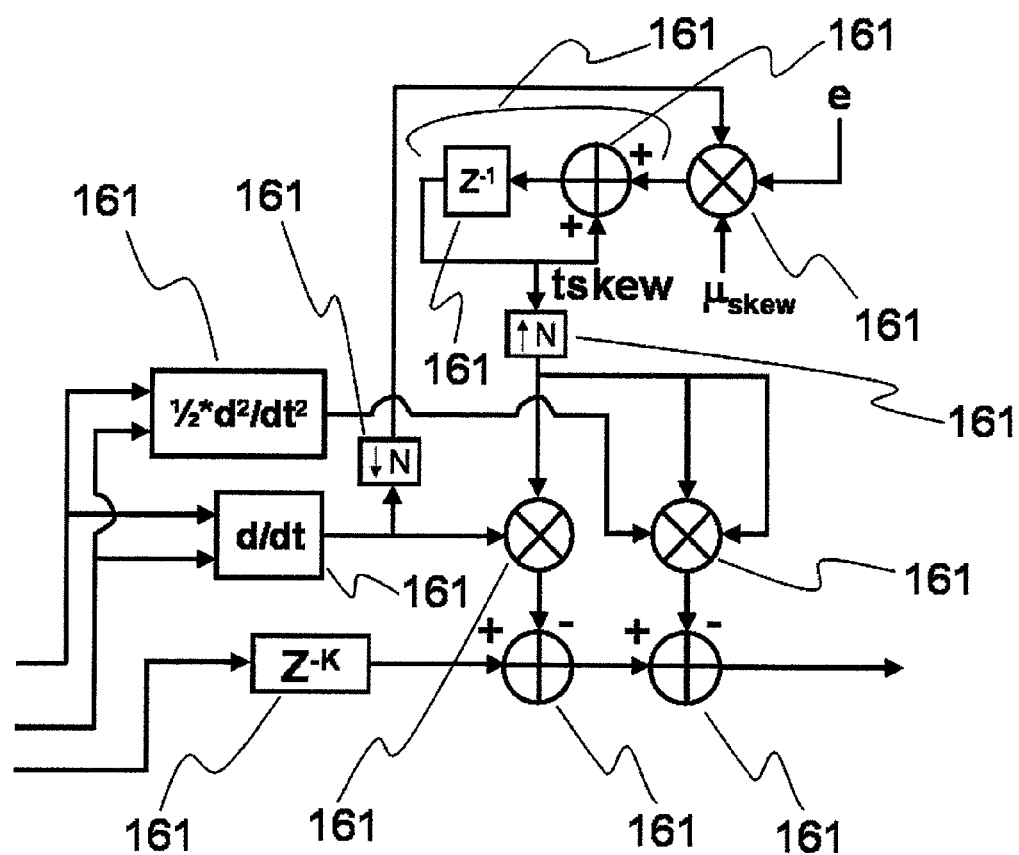
FIG. 16 is a diagram depicting details of the configuration of the third embodiment of the present invention.
Figure 17:
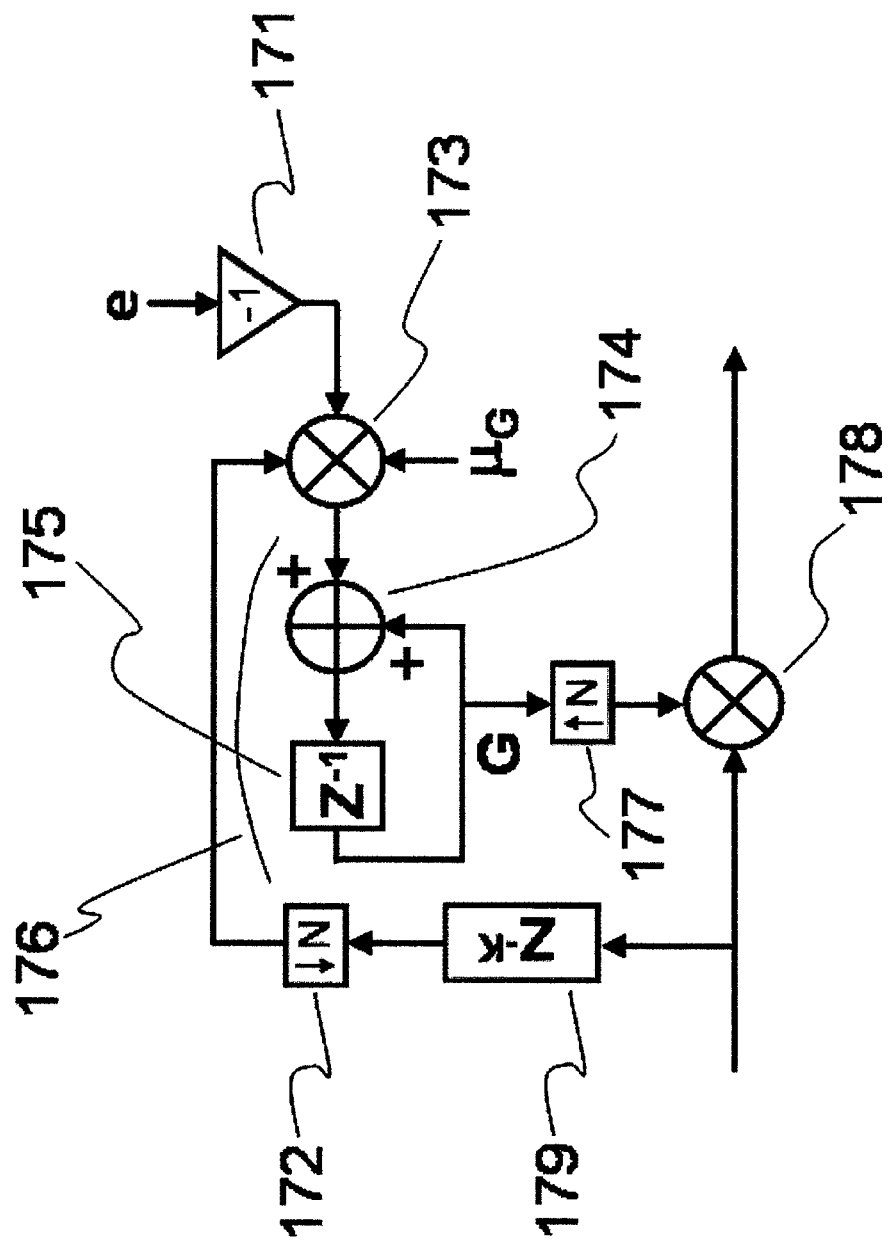
FIG. 17 is a diagram depicting details of the configuration of the third embodiment of the present invention.
Figure 18:
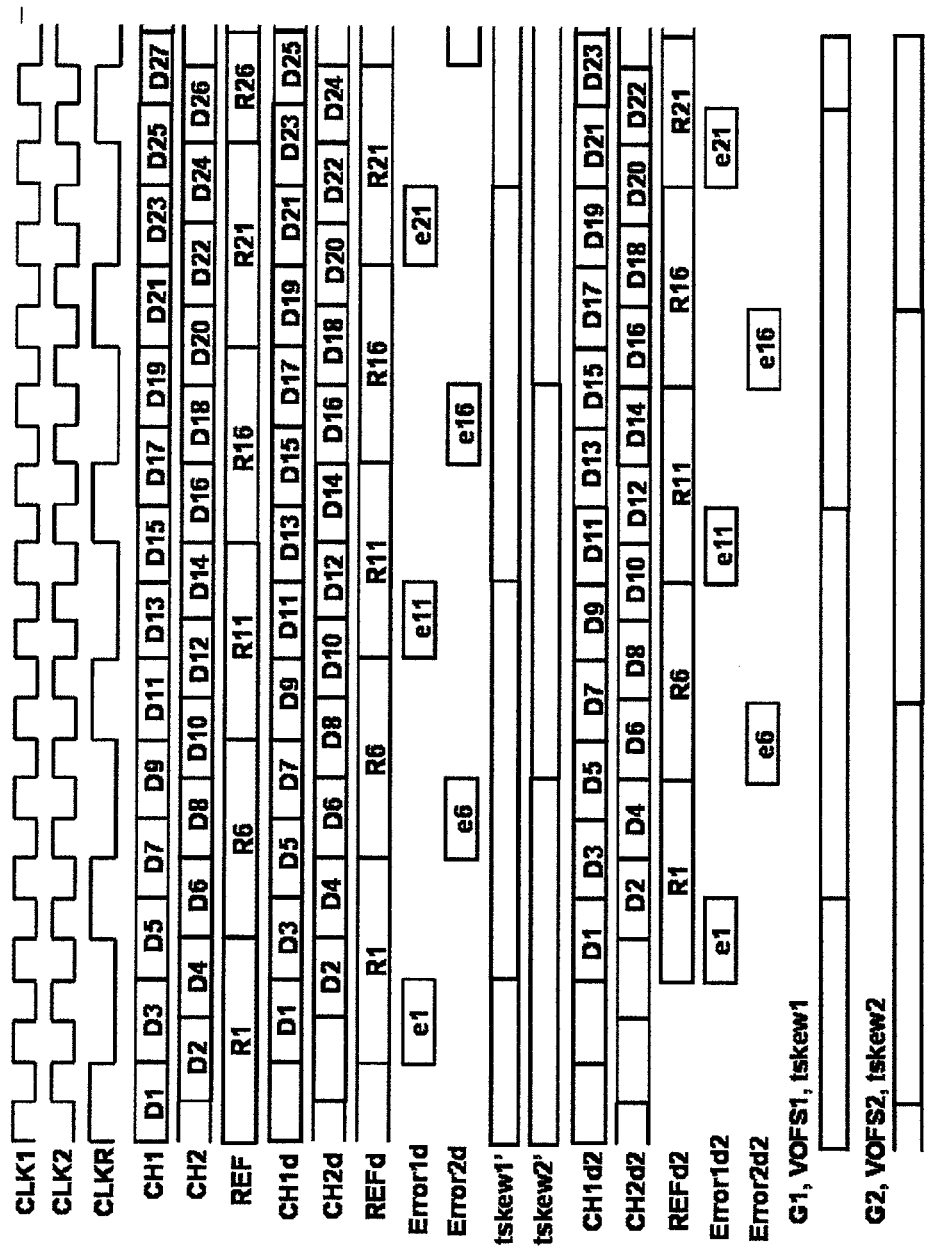
FIG. 18 is a diagram depicting details of a time chart of the third embodiment of the present invention.

FIG. 15 depicts a third embodiment of the present invention. In the present embodiment, the sampling-timing calibration unit in the second embodiment is made to be more accurate. More specifically, sampling-timing calibration units 157 and 158 are configured by connecting the configuration of FIG. 10 described in the second embodiment and the configuration (FIG. 16) similar thereto in series. Accordingly, since a delay corresponding to K samples occurs in the sampling-timing calibration units 157 and 158 described above, compensation is made by a K-sample delayer 161 of FIG. 16. In the second embodiment, since signals used for time differentiation and time second-order differentiation are not subjected to skew calibration, an error occurs in the estimation of these signals, and therefore, there is a limit on the improvement in accuracy of the correction of sampling timing. By contrast, in the present embodiment, after skew mismatch correction is performed to increase signal quality in the configuration of FIG. 10 like the second embodiment, time differentiation and time second-order differentiation are estimated again in the configuration of FIG. 16. Therefore, at this stage, highly-accurate time differentiation and time second-order differentiation can be derived, and as a result, extremely accurate correction of sampling timing is achieved. Note that, while the sampling-timing calibration unit increases correction accuracy with a two-step configuration as described above, correction accuracy can be thought to be further increased when it is extended to three or more step configuration. Also, while the conversion-gain calibration units 153 and 154 in FIG. 15 have the configuration as depicted in FIG. 17, they operate in a basically similar manner to that of the examples depicted in FIG. 5 and FIG. 13 except that the delay amount of the delayer for compensating for the delay time occurring in the time differentiator and the time second-order differentiator described above is different, and therefore, detailed descriptions thereof are omitted. Note that FIG. 18 depicts an operation timing diagram of the present embodiment.

Therefore, according to the present embodiment, it is possible to perform highly-accurate calibration that supports a high-speed sampling rate of the next-generation application and achieves a high resolution in a time-interleaved A/D converter.

Fourth Embodiment

Figure 19:
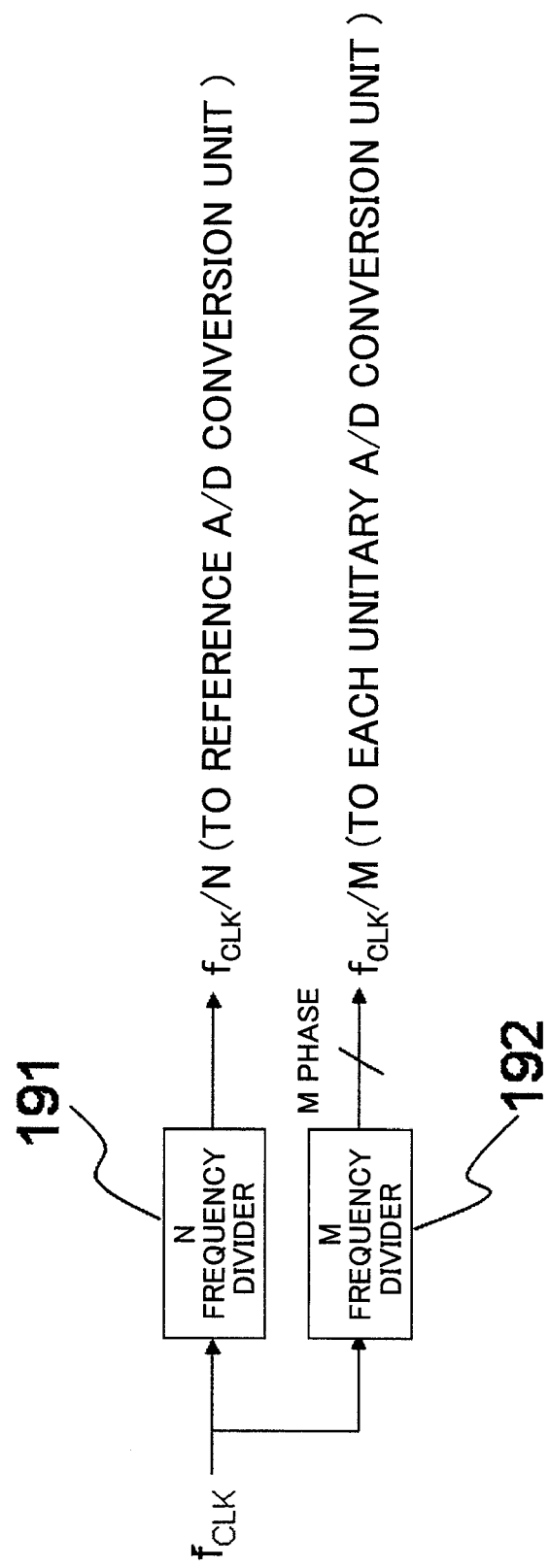
FIG. 19 is a diagram depicting a fourth embodiment of the present invention.

FIG. 19 depicts a configuration example of a CLK generating unit as a fourth embodiment of the present invention. The present embodiment represents a most general example. In order to generate a clock signal having a frequency of fCLK/M required for each unitary A/D conversion unit and a clock signal having a frequency of fCLK/N required for the reference A/D conversion unit, a source CLK signal having a frequency of fCLK is divided by an N frequency divider 191 and an M frequency divider 192, respectively, and an output of the former is supplied to the reference A/D conversion unit and an output of the latter is supplied to each unitary A/D conversion unit. Although the configuration requires a source CLK signal having a frequency equal to the overall sampling rate fCLK of the time-interleaved A/D converter, since the rising edge of the output of the N frequency divider 191 and the rising edge of the output of the M frequency divider 192 both operate only at the rising edge of the source CLK signal, the skew always has a constant value, and the calibration of the sampling timing described above functions most effectively.

Therefore, according to the present embodiment, it is possible to perform highly-accurate calibration that supports a high-speed sampling rate of the next-generation application and achieves a high resolution in a time-interleaved A/D converter.

Fifth Embodiment

Figure 20:
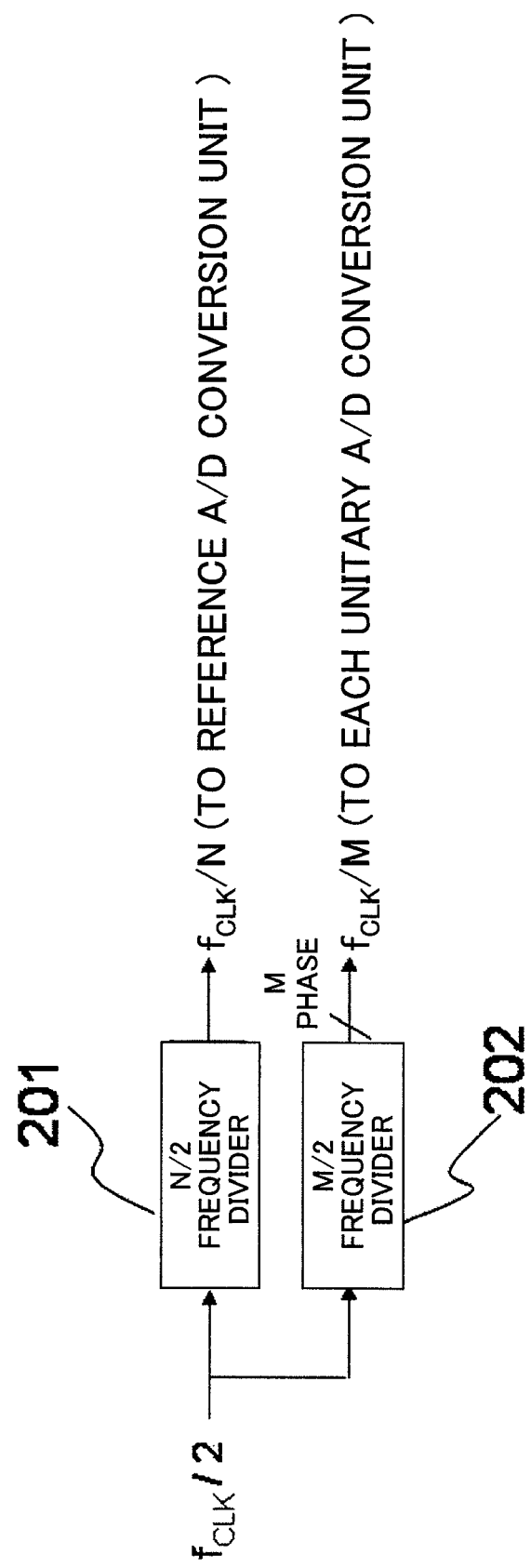
FIG. 20 is a diagram depicting a fifth embodiment of the present invention.

FIG. 20 depicts another configuration example of the CLK generating unit as a fifth embodiment of the present invention. In the present embodiment, the frequency of the source CLK signal is set to fCLK/2. Therefore, in order to generate a clock signal having a frequency of fCLK/M required for each unitary A/D conversion unit and a clock signal having a frequency of fCLK/N required for the reference A/D conversion unit, the source CLK signal is divided by an N/2 frequency divider 201 and an M/2 frequency divider 202, respectively, and an output of the former is supplied to the reference A/D conversion unit and an output of the latter is supplied to each unitary A/D conversion unit. In this configuration, the source CLK signal can have a half of the frequency of the overall sampling rate fCLK of the time-interleaved A/D converter. However, when N and M are odd numbers, the rising edge of the output of the N/2 frequency divider 201 and the rising edge of the output of the M/2 frequency divider 202 alternately operate at the rising edge and the trailing edge of the source CLK signal. Therefore, when the source CLK signal does not exactly have a duty ratio of 50%, the skew of the outputs of these frequency dividers fluctuates, thereby possibly limiting the calibration of sampling timing described above to some degree. However, since N and M are selected so as to be relatively prime to each other as described above, at least one of them is an odd number and the state like this can be achieved.

Therefore, according to the present embodiment, it is possible to perform highly-accurate calibration that supports a high-speed sampling rate of the next-generation application and achieves a high resolution in a time-interleaved A/D converter.

Sixth Embodiment

Figure 21:
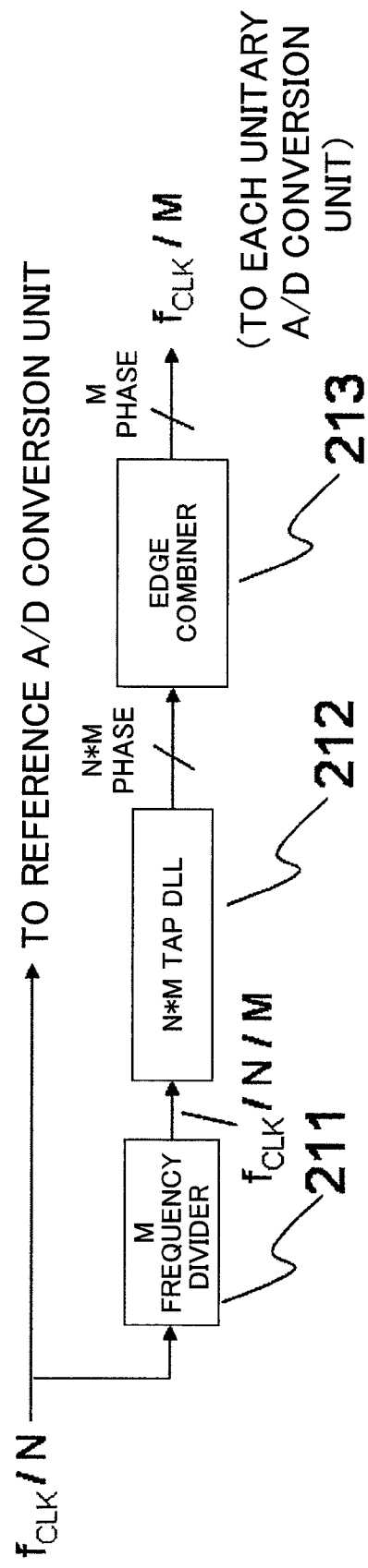
FIG. 21 is a diagram depicting a sixth embodiment of the present invention.

FIG. 21 depicts a still another configuration example of the CLK generating unit as a sixth embodiment of the present invention. In the present embodiment, the frequency of source CLK signal is decreased to fCLK/N required in the reference A/D conversion unit. Thus, a clock signal having a frequency of fCLK/M required for each unitary A/D conversion unit is obtained in the following manner. First, the source CLK signal having a frequency of fCLK/N is divided by an M frequency divider 211 to obtain a CLK signal having a frequency of fCLK/N/M. This signal is input to a DLL (Delay Locked Loop) circuit 212 with N*M taps, and outputs of N*M phases having a time difference of 1/fCLK therebetween are obtained. These outputs are input to an edge combiner circuit 213, and by appropriately combining rising edges of the respective inputs, a new output of an M phase having a frequency of fCLK/M can be generated for each unitary A/D conversion unit. In this configuration, since the source CLK signal can have 1/N of the frequency of the overall sampling rate fCLK of the time-interleaved A/D converter, high-speed CLK is not required. However, due to the processes in the DLL circuit 212 and the edge combiner circuit 213 described above, the skew of the output CLK signal having a frequency of fCLK/M is not constant and may possibly change in time with a pattern. As a result, this can possibly limit the calibration of sampling timing described above to some degree.

Therefore, according to the present embodiment, it is possible to perform highly-accurate calibration that supports a high-speed sampling rate of the next-generation application and achieves a high resolution in a time-interleaved A/D converter.

Seventh Embodiment

Figure 22:
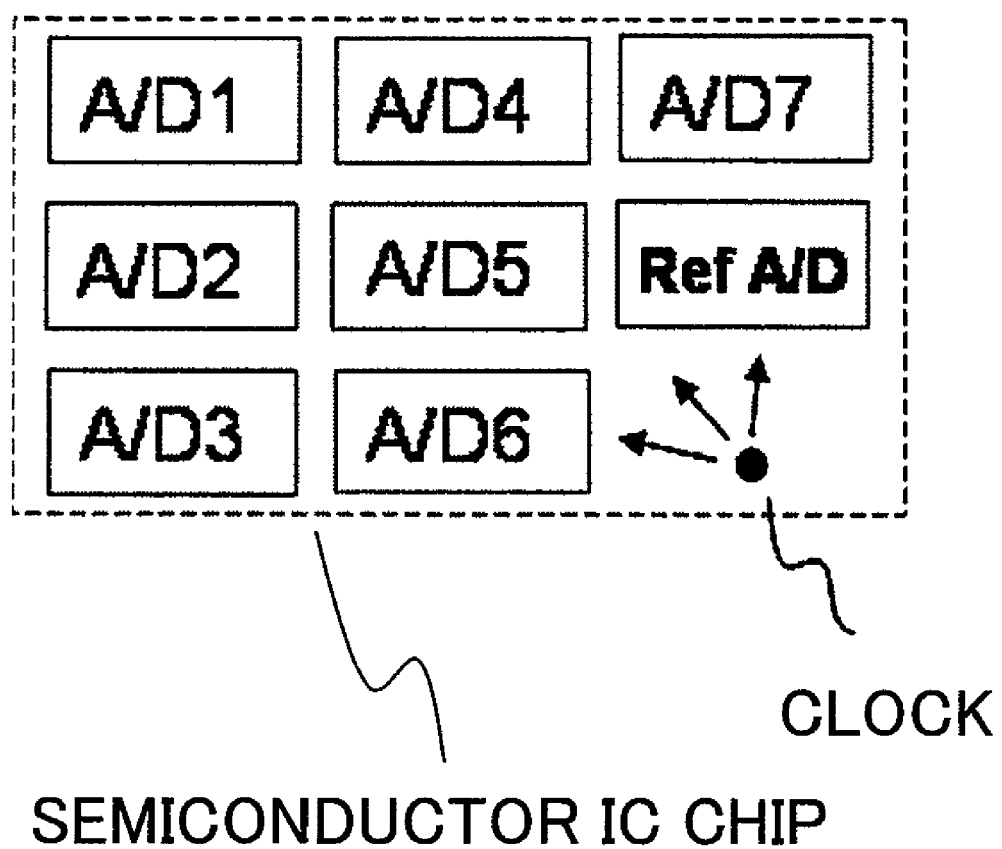
FIG. 22 is a diagram depicting a seventh embodiment of the present invention.

FIG. 22 depicts a seventh embodiment of the present invention. In the present embodiment, a layout example of a chip for achieving the effectiveness of the present invention is depicted. Note that, although the number of unitary A/D conversion units M is 7 in this example, the number is not meant to be restricted by a specific number as long as M is an integer equal to or larger than 2.

In FIG. 22, respective unitary A/D conversion units A/D 1 to A/D 7 and a reference A/D conversion unit Ref A/D are formed on a single semiconductor substrate together with a clock source to configure a semiconductor integrated circuit chip. The respective unitary A/D conversion units A/D 1 to A/D 7 and the reference A/D conversion unit Ref A/D are arranged densely so that a space where none of these are arranged is minimized. In this case, the unitary A/D conversion units and the reference A/D conversion unit whose distances from a clock source are different from each other are combined and included in the layout. However, in the present invention, the influence of the skew of the sampling CLK among the unitary A/D conversion units can be removed by calibration as described above, and therefore, it is generally unnecessary to equalize the length of CLK wiring and to require a suitable arrangement configuration for the respective unitary A/D conversion units.

Therefore, according to the present embodiment, each of the unitary A/D conversion units and the reference A/D conversion unit can be optimally arranged so that, for example, a layout area is minimized, that is, chip cost is minimized without receiving any influence due to a difference in wiring length among the unitary A/D conversion units and the reference A/D conversion unit. In other words, a layout capable of preventing the increase in layout area due to the occurrence of a wasteful space where another circuit block is difficult to be arranged can be achieved.

Eighth Embodiment

Figure 23:
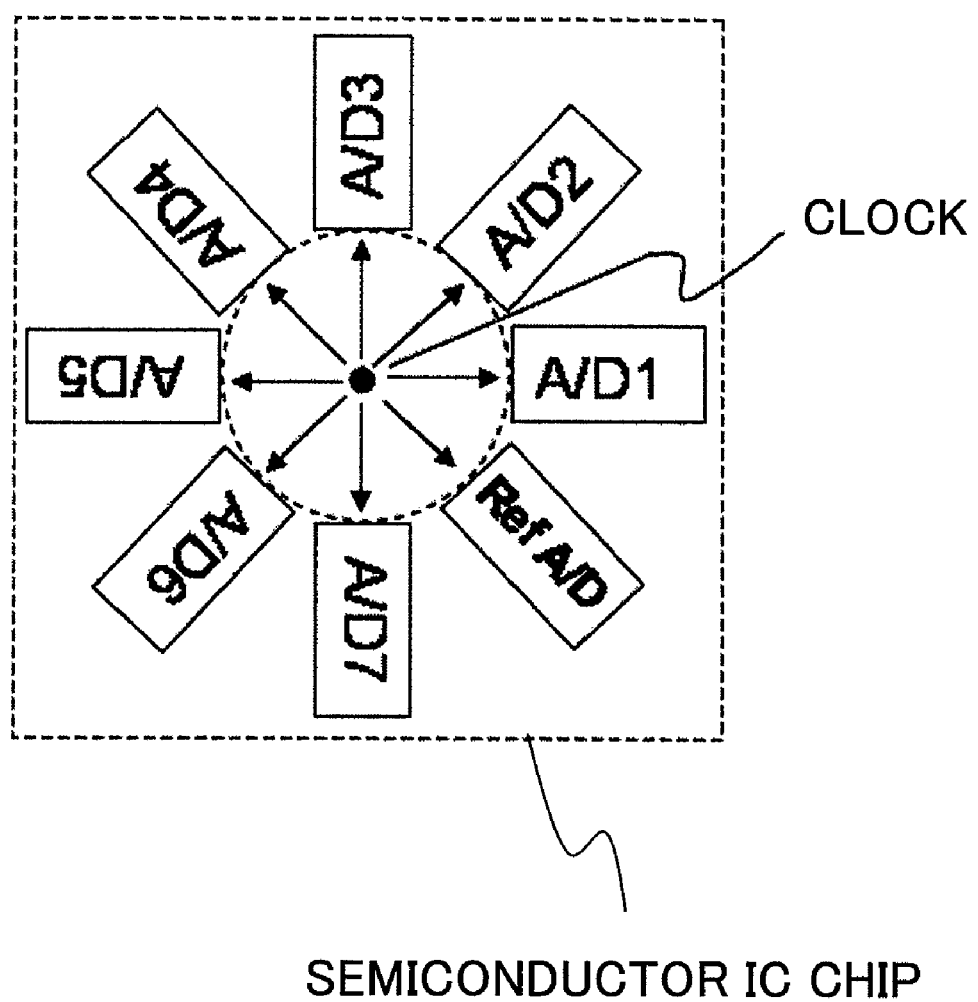
FIG. 23 is a diagram depicting an eighth embodiment of the present invention.

FIG. 23 depicts an eighth embodiment of the present invention. In the present embodiment, another layout example of a chip different from that of the seventh embodiment described above is depicted. Note that, although the number of unitary A/D conversion units M is 7 in this example, the number is not meant to be restricted by a specific number as long as M is an integer equal to or larger than 2.

In the case of the conventional technology without calibration of sampling timing, the CLK wiring to each of the unitary A/D conversion units has to be equalized in length, and therefore, there are restrictions in layout like that depicted in FIG. 23 in which the unitary A/D conversion units and the reference A/D conversion unit are required to be arranged in a circle centering on the clock source. Similarly to the conventional technology, this equal-length CLK wiring arrangement such as the circular arrangement can be applied also when the calibration of the present invention is applied. In FIG. 23, the respective unitary A/D conversion units A/D 1 to A/D 7 and the reference A/D conversion unit Ref A/D are formed on a single semiconductor substrate together with a clock source to configure a semiconductor integrated circuit chip. The respective unitary A/D conversion units A/D 1 to A/D 7 and the reference A/D conversion unit Ref A/D are arranged in a circle so that the distances from the clock source are almost equal to each other. In this case, a space where none of the respective unitary A/D conversion units A/D 1 to A/D 7 and the reference A/D conversion unit Ref A/D are arranged is not minimized, and a so-called loose arrangement is achieved. On the other hand, however, a signal in which the influence of a CLK skew is decreased to some degree by the equal-length wiring is input to each unitary A/D conversion unit and the reference A/D conversion unit.

Therefore, according to the present embodiment, since the influence of the sampling CLK skew is decreased to some degree by the equal-length wiring and the calibration of the present invention is then applied, a load of the calibration on each unitary A/D conversion unit can be mitigated. Also, the present embodiment is particularly effective for the application under severe conditions different from normal one, for example, the application in which the influence of a skew of the sampling CLK among the unitary A/D conversion units and the reference A/D conversion unit cannot be completely removed even with the calibration.

INDUSTRIAL APPLICABILITY

According to the present invention, it is possible to perform highly-accurate calibration that supports a high-speed sampling rate of the next-generation application and achieves a high resolution in a time-interleaved A/D converter.

The invention claimed is:

1. A semiconductor integrated circuit device in which an A/D converter comprising M unitary A/D conversion units different in phase and equal in sampling rate, where M is an integer equal to or larger than 2, the A/D conversion units being connected in parallel to each other, the A/D converter having a sampling rate M times as high as that of the unitary A/D conversion unit, is formed on a single semiconductor substrate together with a clock source, wherein
   in the A/D converter,
   a reference A/D conversion unit having a lower sampling rate and a higher resolution than the unitary A/D conversion units is connected in parallel to the M unitary A/D conversion units,
   when the sampling rate of the A/D converter is N times as high as the sampling rate of the reference A/D conversion unit, where N is an integer equal to or larger than 2, M and N are relatively prime to each other, and
   the A/D converter has a function of performing calibration for each of the M unitary A/D conversion units based on an output of the reference A/D conversion unit,
   each of the unitary A/D conversion units and the reference A/D conversion unit are arranged so that a space where none of each of the unitary A/D conversion units and the reference A/D conversion unit are arranged is minimized, and
   there is a combination of the unitary A/D conversion units and the reference A/D conversion unit whose distances from the clock source are different from each other.

2. The semiconductor integrated circuit device according to claim 1, wherein
   the calibration is post-calibration to be performed in a digital region for each output of the M unitary A/D conversion units.

3. The semiconductor integrated circuit device according to claim 2, wherein
   the post-calibration is executed in a background during a normal operation of the A/D converter.

4. The semiconductor integrated circuit device according to claim 1, wherein
   a sampling timing of the unitary A/D conversion unit is generated by an operation clock input to each of the M unitary A/D conversion units, and
   the sampling rate corresponds to an operation clock frequency, which is a frequency of the operation clock.

5. An A/D converter comprising:
   M unitary A/D conversion units different in phase and equal in sampling rate, where M is an integer equal to or larger than 2, the A/D conversion units being connected in parallel;
   a reference A/D conversion unit connected in parallel to the M unitary A/D conversion units and having an operation clock frequency set to 1/N of an overall sampling rate of the A/D converter; and
   M calibration units each performing calibration at an output of a corresponding unitary A/D conversion unit, and each having a sampling-timing calibration unit adapted to correct a sampling timing of the corresponding unitary A/D conversion unit so as to be equal to a sampling timing of the reference A/D conversion unit,
   wherein each of the sampling-timing calibration units comprises:
   a subtracting unit adapted to calculate a conversion error signal which is a difference between an output of the calibration unit and an output of the reference A/D conversion unit;
   a time differentiation deriving portion that derives a time differentiation of an input signal to the sampling-timing calibration unit;
   a multiplier adapted to multiply the conversion error signal and the time differentiation; and
   an accumulator integrating an output of the multiplier,
   wherein M and N are relatively prime to each other, and
   wherein each of the sampling-timing calibration units performs calibration by using an output of the accumulator.

6. The A/D converter according to claim 5, wherein
   an LMS (Least Mean Square) algorithm is applied as an algorithm for the calibration.

7. The A/D converter according to claim 5, wherein the time differentiation deriving portion includes a difference unit.

8. The A/D converter according to claim 5, wherein
   the operation clock frequency of the reference A/D conversion unit is set to be smaller than an operation clock frequency of each of the unitary A/D conversion units.

9. The A/D converter according to claim 5, wherein
   the time differentiation deriving portion includes a first-order time differentiator.

10. The A/D converter according to claim 9, wherein
   an FIR filter having fixed tap coefficients obtained from a sampling theorem and a window function is used as the first-order time differentiator.

11. The A/D converter according to claim 5, wherein
the time differentiation deriving portion further includes a second-order time differentiator.

12. The A/D converter according to claim 11, wherein
an FIR filter having fixed tap coefficients obtained from a sampling theorem and a window function is used as the second order time differentiator.

13. The A/D converter according to claim 5, wherein
each of the calibration units includes plural calibration stages that are cascade-connected.

14. The A/D converter according to claim 13, wherein the plurality of calibration stages include a calibration stage to correct sampling timing and at least one calibration stage to perform calibration of a parameter other than sampling timing.

15. The A/D converter according to claim 14, wherein said parameter is selected from the group consisting of conversion gain, DC offset voltage, non-linearity and frequency characteristics.

16. The A/D converter according to claim 13, wherein the plurality of calibration stages include a calibration stage to correct sampling timing and a plurality of stages to correct selected parameters selected from the group consisting of conversion gain, DC offset voltage, non-linearity and frequency characteristics.

17. The A/D converter according to claim 5, wherein
at least one of the operation clock frequency of the reference A/D conversion unit and an operation clock frequency of each of the unitary A/D conversion units is generated by using an odd number/2 frequency divider.

18. The A/D converter according to claim 5, wherein
at least one of the operation clock frequency of the reference A/D conversion unit and an operation clock frequency of each of the unitary A/D conversion units is generated by using a DLL (Delay Locked Loop) circuit and an edge combiner circuit.

* * * * *